United States Patent
Voutsas

(10) Patent No.: US 6,329,270 B1
(45) Date of Patent: *Dec. 11, 2001

(54) LASER ANNEALED MICROCRYSTALLINE FILM AND METHOD FOR SAME

(75) Inventor: Tolis Voutsas, Portland, OR (US)

(73) Assignee: Sharp Laboratories of America, Inc., Camas, WA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/248,629

(22) Filed: Feb. 11, 1999

Related U.S. Application Data

(60) Continuation-in-part of application No. 09/135,393, filed on Aug. 17, 1998, now Pat. No. 5,959,314, which is a division of application No. 08/812,580, filed on Mar. 7, 1997, now Pat. No. 5,827,773.

(51) Int. Cl.[7] .............................. H01L 21/20; H01L 21/00
(52) U.S. Cl. ........................ 438/488; 438/489; 438/485; 438/96
(58) Field of Search ................................. 438/488, 489, 438/485, 96; 427/578

(56) References Cited

U.S. PATENT DOCUMENTS

| | | | |
|---|---|---|---|
| 4,578,696 | * 3/1986 | Uneo et al. | 357/59 |
| 4,822,636 | * 4/1989 | Saitoh et al. | 427/69 |
| 4,986,213 | 1/1991 | Yamazaki et al. | 118/719 |
| 5,171,710 | 12/1992 | Yamazaki et al. | 437/174 |
| 5,184,200 | * 2/1993 | Yamanobe | 257/53 |
| 5,210,766 | * 5/1993 | Winer et al. | 372/40 |
| 5,221,365 | * 6/1993 | Noguchi | 136/258 |
| 5,296,405 | 3/1994 | Yamazaki et al. | 437/174 |
| 5,313,076 | 5/1994 | Yamazaki et al. | 257/66 |
| 5,424,230 | 6/1995 | Wakai | 437/40 |
| 5,548,132 | * 8/1996 | Batra et al. | 257/66 |
| 5,624,873 | 4/1997 | Fonash et al. | 438/487 |

(List continued on next page.)

FOREIGN PATENT DOCUMENTS 9-36376    7/1995   (JP) .

OTHER PUBLICATIONS

Article entitled "Deposition of Precursor Poly–Silicon Films for Flat Panel Display Applications" by R. Pethe, C. Deshpandey, S. Dixit, E. Demaray, D. Meakin, D. Orgill, N. Turner published in Mat. Res. Soc. Symp. Proc. vol. 471, 1997, pp 3–7.

*Primary Examiner*—Olik Chaudhuri
*Assistant Examiner*—Shrinivas H. Rao
(74) *Attorney, Agent, or Firm*—David C. Ripma; Matthew D. Rabdau; Scott C. Krieger

(57) ABSTRACT

A method is provided of fabricating a thin film transistor semiconductor film of polycrystalline silicon on a transparent substrate suitable for the manufacture of a liquid crystal display. The deposition of silicon film at very low rates provides conditions for the optimum formation of microcrystallites. As the amorphous silicon is annealed, crystal grains, begun from the seed crystals, are formed in the resulting polycrystalline silicon. The seed crystals help regulate the annealment process, and reduce process dependence on precision deposition and heating methods. This microcrystalline film results in a polycrystalline film having larger crystal grains, and crystal grains of a relatively uniform size. The invention relies on a quantifiable relationship between the pre-melt crystalline fraction and crystallite density, post-melt crystalline fraction and crystallite density, and the ELA density during annealing. An LCD with a TFT polycrystalline film layer over a transparent substrate, formed from annealing substantially amorphous silicon with suspended seed crystals, is also provided.

6 Claims, 10 Drawing Sheets

U.S. PATENT DOCUMENTS

| | | | |
|---|---|---|---|
| 5,677,236 | * 10/1997 | Itoh et al. | 437/109 |
| 5,686,349 | 11/1997 | Nakata | 437/101 |
| 5,753,542 | 5/1998 | Yamazaki et al. | 438/162 |
| 5,796,116 | 8/1998 | Nakata et al. | 257/66 |
| 5,834,071 | 11/1998 | Lin | 427/578 |
| 5,834,345 | 11/1998 | Shimizu | 438/158 |
| 5,834,796 | 11/1998 | Matsuda et al. | 257/57 |
| 5,904,770 | * 5/1999 | Ohtani et al. | 117/103 |
| 5,940,693 | * 8/1999 | Mackawa | 438/166 |
| 6,194,023 | * 2/2001 | Mitsuhashi et al. | 427/8 |

* cited by examiner

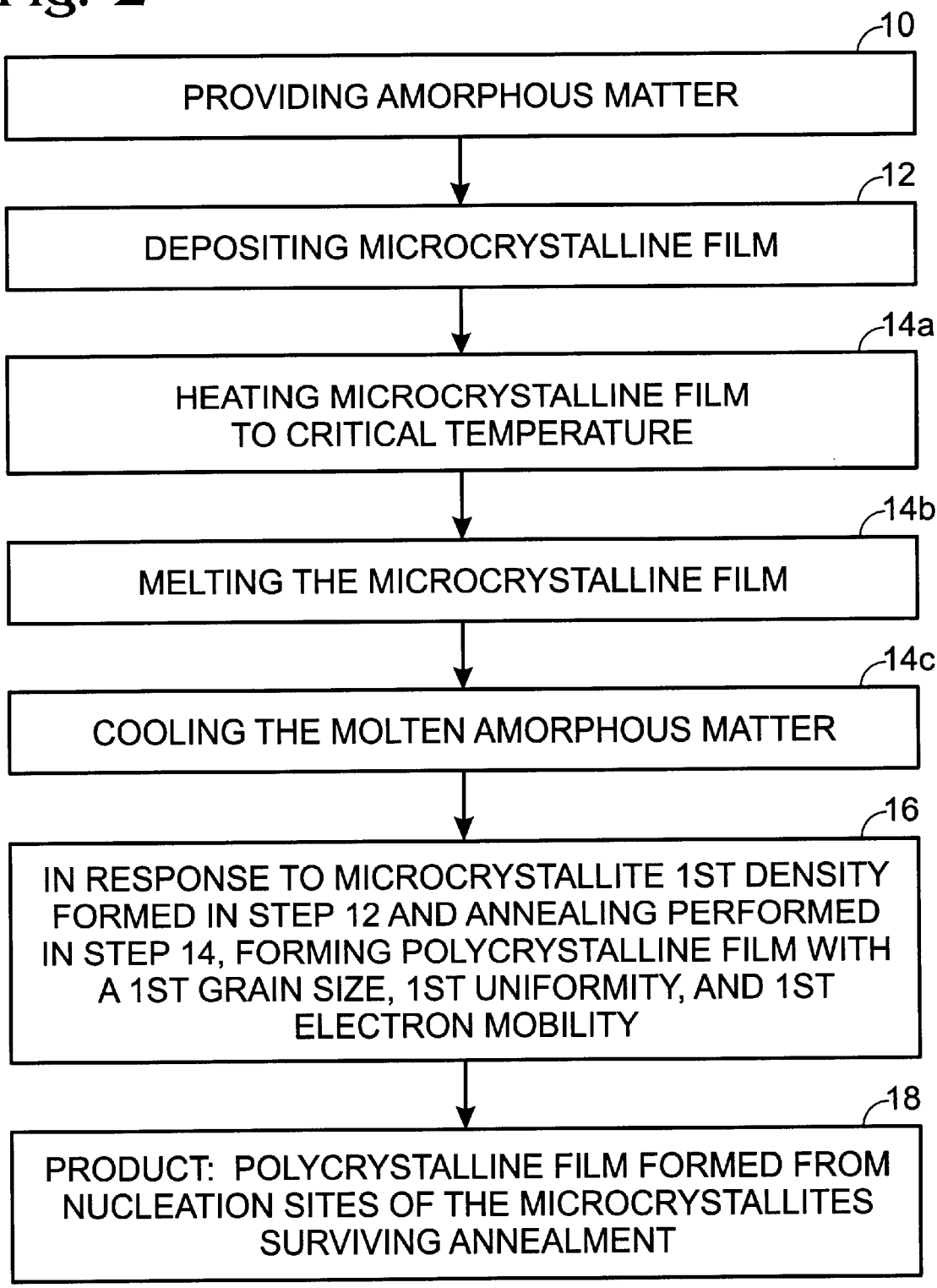

LASER ANNEALED MICROCRYSTALLINE FILM AND METHOD FOR SAME

This application is a C-I-P of Ser. No. 09/135,393 filed Aug. 17, 1998, now U.S. Pat. No. 5,959,314 which is a Division of Ser. No. 08/812,580 filed Mar. 7, 1997 now U.S. Pat. No. 5,827,773.

BACKGROUND AND SUMMARY OF THE INVENTION

This invention relates generally to thin film transistor (TFT) processes and fabrication, and more particularly, to a polycrystalline film, and method of forming the polycrystalline film, from a microcrystalline film.

Low-temperature polysilicon formation is a process that has been intensively investigated for more than a decade now. These investigations have become more important due to the potential of this material in flat panel display related technology, particularly, in the area of active matrix liquid crystal displays (AMLCDs). Polysilicon TFTs offer the advantages of: (a) smaller device dimensions, thus higher aperture ratio for the display; (b) higher TFT "on" current, thus less sensitivity to gate and bus line signal delays; and, (c) elimination of external drivers and interconnects, thus possible yield and cost improvement (especially in small size displays).

Earlier efforts focused on the formation of polysilicon by SPC methods (i.e. low temperature furnace anneal). Recently, significant emphasis has been placed on excimer laser anneal as a more suitable process for the formation of high quality polysilicon material from an amorphous-silicon precursor film. ELA technology has significantly matured over the past decade. A number of commercial tools are currently available to flat panel display manufacturers. However, problems still plague this process. Control of grain size is difficult, especially under operation close to the super-lateral-growth (SLG) regime, where small variations in laser energy density result in large variations in grain size. Uniformity of grain size is another major issue, especially in the overlap region between successive laser beam shots. Moreover, damage of the underlying substrate is another problem, typically encountered as the energy density of the laser increases to accommodate a larger grain size in the annealed polysilicon layer.

In light of these problems, it is desirable to develop a process that can compensate for some of the intrinsic shortcomings of ELA. More specifically, it is desired to obtain high quality polysilicon at the minimum laser energy "load", to avoid hardware instabilities and substrate damage. This issue becomes even more important as technology moves to cheaper substrates, such as soda-lime glasses or organic substrates. Furthermore, it is desirable to reduce the variability of the polysilicon material characteristics by appropriate engineering of the structure of the silicon film precursor. The method of depositing amorphous silicon on the transparent substrate is also crucial in the fabrication of polycrystalline films having large crystal grains. Previous work in the area of solid phase crystallization of silicon has indicated that certain control of the structural characteristics of polysilicon is possible through materials engineering of the phase of the as-deposited film. Recent evidence has found that the starting phase of the film affects the crystalline characteristics of the post-ELA (excimer laser annealed) polysilicon.

Typically, an LCD is made by mounting a transparent substrate on a heated susceptor. The transparent substrate is exposed to gases which include elements of silicon and hydrogen. The gases decompose to leave solid phased silicon on the substrate. In a plasma-enhanced chemical vapor deposition (PECVD) system, the decomposition of source gases is assisted with the use of radio frequency (RF) energy. A low-pressure (LPCVD), or ultra-high vacuum (UHV-CVD), system pyrolytically decomposes the source gases at low pressures. In a photo-CVD system the decomposition of source gases is assisted with photon energy. In a high-density plasma CVD system high-density plasma sources, such as inductively coupled plasma and helicon sources are used. In a hot wire CVD system the production of activated hydrogen atoms leads to the decomposition of the source gases.

It would be advantageous if a high quality polycrystalline film could be obtained by excimer laser crystallization, at low levels of laser energy density.

It would be advantageous if crystallization process steps could be reduced by optimization of the deposition and annealing procedures. It would also be advantageous if good crystal structural characteristics could be obtained with a low variability against disturbance factors (i.e. variation in laser energy density and/or other process parameters).

It would be advantageous if a polycrystalline film could be fabricated on a transparent substrate having an electron mobility of 150 cm$^2$/Vs, or more.

Accordingly, a method of forming a polycrystalline film having high electron mobility and low threshold voltage is provided. The method comprises the steps of:

a) depositing a microcrystallite film having a microcrystallite density and a microcrystallite size;

b) annealing the microcrystallite film; and c) in response to the microcrystallite density and size and the annealing, forming a polycrystalline film having a polycrystalline grain size and a polycrystalline grain size uniformity. The embedded microcrystallite seed crystals surviving annealment form nucleation sites in the polycrystalline film. That is, the crystal grains are directly responsive to quantifiable variables such as microcrystallite size, density, and annealing energies.

Specifically, the step of annealing involving heating the microcrystalline film, melting the amorphous matter, selectively melting microcrystallites, and cooling the microcrystalline film. A second density of unmelted microcrystallites are left embedded in the molten amorphous matter. Then, Step c) includes crystallizing the amorphous matter melted in Step b), using the unmelted microcrystallites as nucleation sites. The polycrystalline film grain size is responsive to the size and density of unmelted microcrystallites.

Generally, the microcrystalline is formed on a first region adjacent, and overlying the transparent substrate. Step b) includes selectively melting the microcrystalline film so that the second density of microcrystallites is primarily in the first region adjacent the transparent substrate.

Step a) includes forming a first microcrystallite crystalline fraction which is a product of the first microcrystallite size and the first microcrystallite density, and in which the first crystalline fraction in the range of approximately 0.01 to 80%. In some aspects of the invention, where larger sized microcrystallites are used, the pre-melt (as-deposited) crystalline fraction is in the range 0.01 to 25%. The typical as-deposited microcrystallite size is between 150 to 300 Å, although microcrystallites as large as approximately 1000 Å are useful.

Step b) includes forming microcrystallites having a post-melt microcrystallite size and post-melt microcrystallite density. The post-melt size and density is the result of the annihilation of microcrystallites smaller than a microcrystallite critical size and the partial melting of microcrystallites having a pre-melt size larger than the critical size. Then, Step b) includes forming a post-melt microcrystalline film.

Because the melting process annihilates microcrystallites smaller than the critical size, the percentage of microcrystallites having a size less than the average, post-melt size, is smaller than the percentage of smaller than average sized pre-melt microcrystallites. Thus, the post-melt microcrystallites are more uniform in size. The more uniformly sized post-melt microcrystallites result better control of the post-melt microcrystallite density. The polycrystalline grains are more directly responsive to the post-melt crystalline fraction than most of the other process variables. A post-melt density of at least approximately $1 \times 10^8$ microcrystallites per cm$^2$ has been found to be effective, with approximately a 1 micron average separation between microcrystallites.

Preferably, Step b) includes uses an excimer laser crystallization (ELC) process, having a wavelength of approximately 308 nm, or less, to melt the amorphous matter and selectively melt the microcrystallites. The post-melt crystalline fraction is responsive to the ELC energy density as well as the pre-melt crystalline fraction.

In one aspect of the invention, Step a) includes depositing the microcrystalline film by a PECVD process using a SiH$_4$ and H$_2$ gas mixture. The deposition process includes using a power level of approximately 0.16783 W per cm$^2$, at a temperature of approximately 320° C., a total pressure of approximately 1.2 Torr, and a flow rate of SiH$_4$ to H$_2$ of approximately 100:1.

FIG. 1a shows deposition rate v. the percentage of crystalline fraction. The deposition rate is critical to the pre-melt crystalline fraction. When the microcrystalline film deposition rate is less than 2 Å per second (Å/s), a crystalline fraction as high as 80% can be formed. Higher deposition rates can be used to form a crystalline fraction in the range between 0.01% and 50%. Preferably, the microcrystalline film is deposited with the PECVD method at a deposition rate of less than 10 Å/s and a deposition temperature of approximately 380 degrees C.

A liquid crystal display (LCD) is also provided comprising a transparent substrate and a TFT polycrystalline semiconductor film, overlying the transparent substrate, which has an electron mobility of greater than 150 cm$^2$/Vs, a threshold voltage less than 2 volts, a grain size larger than 0.5 microns, and grain size uniformity of less than 10%. The polycrystalline film is formed from the above-described method. Namely, depositing amorphous matter in deposition conditions which result in a microcrystalline film having a pre-melt crystalline fraction; annealing the microcrystalline film, with the annealing process selectively melting of microcrystallites to from a post-melt crystalline fraction; and, forming the polycrystalline TFT film with an electron mobility responsive to the post-melt crystalline fraction.

BRIEF DESCRIPTION OF THE DRAWINGS

FIG. 2 is a flowchart illustrating the present invention method for forming a polycrystalline film having high electron mobility and a low threshold voltage.

DETAIL DESCRIPTION OF THE PREFERRED EMBODIMENT

In the present invention, excimer laser anneal (ELA) processes are described for the phase transformation of amorphous to polycrystalline silicon (polysilicon). Polysilicon films, obtained from laser annealed microcrystalline silicon, demonstrate a larger grain size than that of laser annealed amorphous silicon films. This grain size enhancement is attributed to the embedded nucleation seeds in the microcrystalline film that survive the melting process during laser annealing. Proper engineering of the as-deposited film structure, via optimization of deposition conditions, yields at least a twofold increase in the grain size of the post ELA polysilicon films.

The measurement of grain attributes is considered with respect to digitized versions of TEM micrographs. Some grain attributes are: grain area, grain perimeter, grain major axis, grain minor axis, and grain shape factor. The last attribute is a measure of how circular the grain is and is calculated as:

$$S_f = 4\pi \cdot (area)/(perimeter)^2 \qquad (1)$$

According to this definition, a perfect circle has a shape factor of 1.0 and a line has a shape factor that approaches zero. The average shape factor of the grains of the laser annealed polysilicon films of the present invention are in the range of 0.72–0.74, indicating quite regularly shaped (equiaxial) grains. An equivalent grain size is defined to be based on the measured major and minor axes. The equivalent grain size is given by the geometric mean of the major and minor axes as:

$$r = \sqrt{(a \cdot b)} \qquad (2)$$

where r is the equivalent grain size, a is the major axis of the grain, and b is the minor axis of the grain.

Figure 1A:
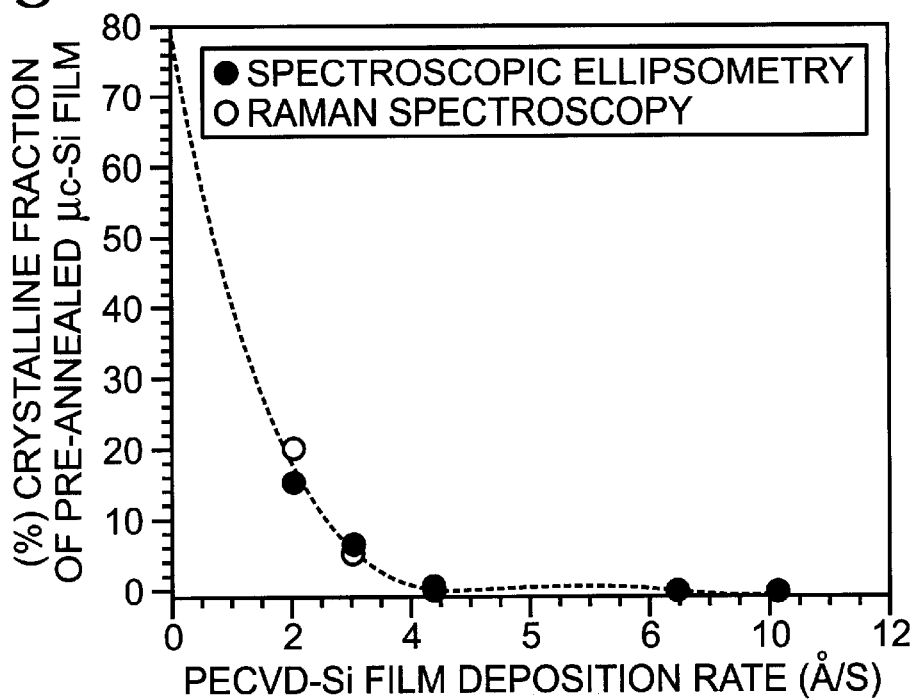
FIG. 1a shows deposition rate v. the percentage of crystalline fraction.
Figure 1B:
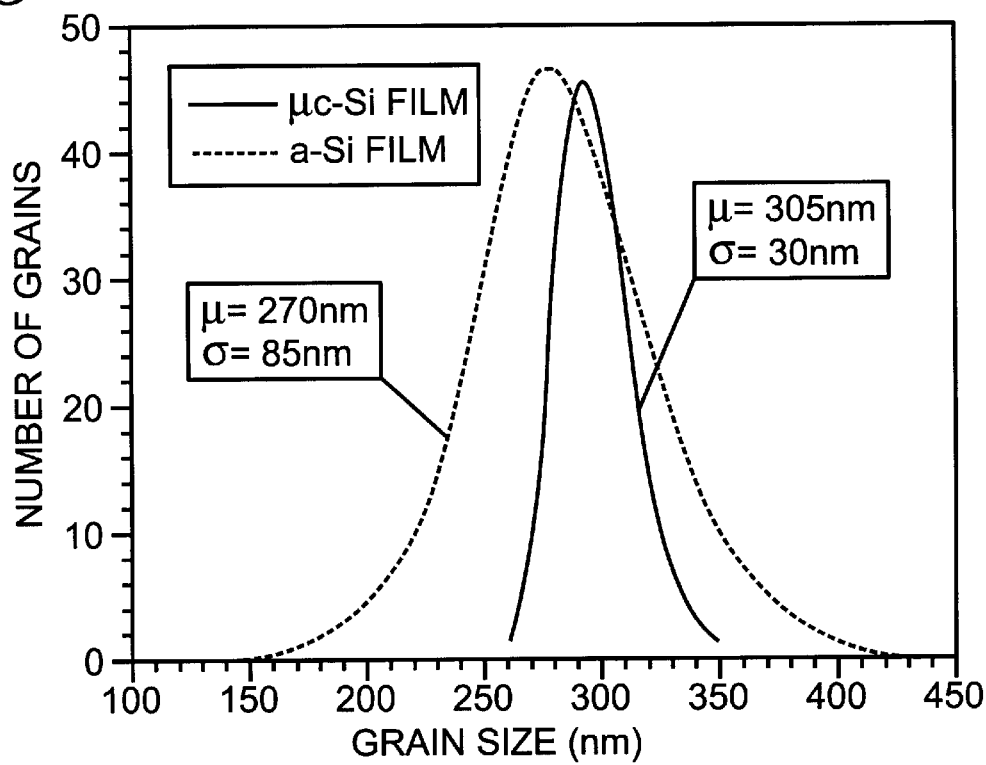
FIG. 1b illustrates the concept of grain size uniformity.

FIG. 1b illustrates the concept of grain size uniformity. The uniformity of the grain size is defined as the ratio of the standard deviation (σ) to the average grain size (μ). FIG. 1b illustrates typical grain size distributions obtained from polycrystalline films resulting from excimer laser crystallization of amorphous silicon (dotted line curve) and microcrystalline (solid line curve) film precursors. The statistics of mean (μ) and standard deviation (σ) for each distribution are displayed. The uniformity of grain size is calculated by dividing the standard deviation by average. To express as a percentage, the above-calculated uniformity is multiplied by 100. The microcrystalline precursor of FIG. 1b has a uniformity of 9.8%, while the amorphous silicon precursor has a uniformity of 31.5%.

FIG. 2 is a flowchart illustrating the present invention method for forming a polycrystalline film having high electron mobility and a low threshold voltage. Step 10 provides amorphous matter. Step 12 deposits amorphous matter embedded with microcrystallites having a first predetermined microcrystallite density and a first predetermined microcrystallite size. Typically, the amorphous matter and microcrystallites deposited in Step 12 are silicon. Alternately, the amorphous matter and microcrystallites deposited in Step 12 are a silicon-germanium compound. In this manner, a microcrystalline film is formed. Typically, Step 12 includes depositing a microcrystalline film having a thickness of less than approximately 1000 Å, whereby the polycrystalline film is well suited to the manufacture of thin film transistors. The preferred thickness is less than approximately 400 Å.

Step 14 anneals the microcrystallite film deposited in Step 12. Step 16, in response to the microcrystallite first density and microcrystallite first size formed in Step 12, and the annealing performed in Step 14, forms a polycrystalline film having a first polycrystalline grain size of greater than 0.5 microns and a first polycrystalline grain size uniformity of less than 10%. Step 18 is a product where the embedded microcrystallite seed crystals surviving annealment form nucleation sites in the polycrystalline film.

Preferably, a transparent substrate selected from the group consisting of glass, quartz, and plastic is provided and Step 12 includes depositing the microcrystalline film on the transparent substrate. In this manner, a polycrystalline film is formed suitable for a TFT on an LCD.

Specifically, Step 14 includes sub-steps. Step 14a heats the microcrystalline film deposited in Step 12 to a critical temperature. At a critical temperature the amorphous matter and microcrystallites begin to melt. The critical temperature for amorphous matter is lower than it is for microcrystallites (single crystal material). Further, as is discussed below, the melting rates of amorphous matter and microcrystallites are different. Therefore, the calculus of melting is complex, involving material, temperature, and melting rates.

Step 14b is the melting phase of annealing, which is responsive to reaching the critical temperature in Step 14a and the first microcrystallite size deposited in Step 12. Step 14b melts the amorphous matter and selectively melts microcrystallites, leaving unmelted microcrystallites embedded in the molten amorphous matter. Typically, the matter continues to melt as long as the matter is above the critical temperature. Step 14c is the cooling phase of the annealing process, where the matter made molten in Step 14b is permitted to cool to the critical temperature. When a laser is used, the laser shot typically occurs during Step 14a, the energy imparted into the microcrystalline film melts the microcrystalline film in Step 14b. Eventually, the microcrystalline film cools to the critical temperature. In a single region of microcrystalline film, Step 16 follows Step 14c. However, if the film as a whole is considered, the timing of Steps 14c and 16 can be coincident, or Step 16 may even precede Step 14c, as the film has different temperatures and temperature gradients in different film regions.

Regardless, Step 16 includes crystallizing the amorphous matter melted in Step 14b using the unmelted microcrystallites as nucleation sites, whereby the polycrystalline film grain size is responsive to the size and density of unmelted microcrystallites. Step 16 is distinct from Step 14c in that matter does not necessarily form a crystal structure at the change of temperature. The matter is crystallized along a lateral growth velocity, discussed in more detail below. Specifically, the present invention method permits a polycrystalline product in Step 18 with a first grain size of at least approximately 1 micron, a first uniformity, or difference of grain sizes, of less than approximately 10%, a first electron mobility of greater than approximately 150 cm$^2$/Vs.

Figure 3:
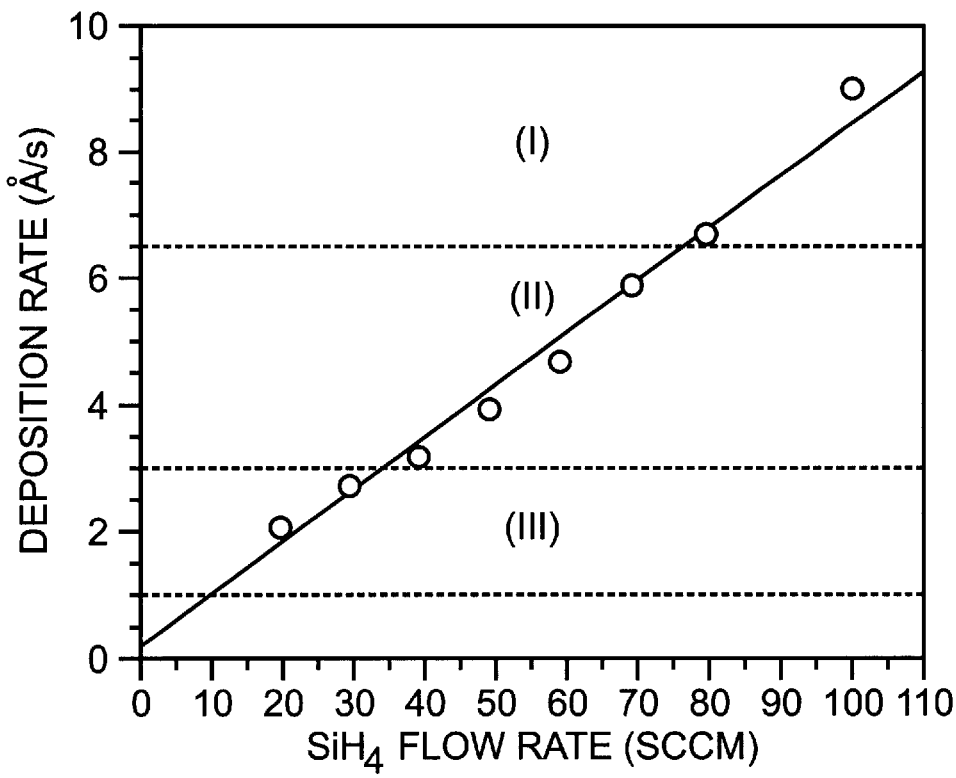
FIG. 3 illustrates the relationship between SiH$_4$ flow rate and amorphous film deposition rate.

FIG. 3 illustrates the relationship between SiH$_4$ flow rate and amorphous film deposition rate. In one aspect of the present invention, silicon films are deposited by PECVD over a wide range of conditions. The deposition rate of the film is a critical factor in determining the microstructure of the deposited layer. The key factors affecting the rate are the flows of reacting gases (SiH$_4$ and H$_2$), and the process pressure. The plasma power has a minor effect (within the range of 0.15 W/cm$^2$ to 0.30 W/cm$^2$). There is little sensitivity to the deposition temperature (in the range of 320–390° C.).

During plasma decomposition of silane a complicated network of chemical reactions typically occurs. However, the net reaction can be expressed by:

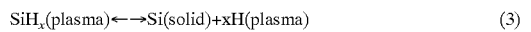

$$\text{SiH}_x(\text{plasma}) \leftarrow \rightarrow \text{Si}(\text{solid}) + x\text{H}(\text{plasma}) \qquad (3)$$

The forward reaction represents film deposition, while the reverse reaction film "etching". The exact rate of growth of the film depends upon the balance between these two reactions. Under standard deposition conditions, the reaction is far from its equilibrium point, leading to film deposition. It should be noted, however, that even in the case of undiluted source gas, the reverse ("etching") reaction does occur. Increasing silane flow rate and/or the total pressure results in increasing the rate of the forward reaction (deposition rate increases). Adding hydrogen to the source gas, pushes the reaction described in equation (3) in the reverse direction. Thus, hydrogen effectively decreases the deposition rate of the film by promoting film erosion. This "erosion" mechanism results in removal of energetically unfavorable configurations, which typically tend to be weakly bonded silicon atoms. Since crystalline phase is the lowest energy configuration, it often is the survived structure. Unlike processing at high temperatures, the low temperatures typical of PECVD process result in limited grain growth, and the material obtained is typically viewed as microcrystalline silicon. Fine polycrystalline silicon structures, however, are obtainable.

Increasing plasma power is another way to increase the rate of the "etching" reaction. However, the rate of the forward reaction is also boosted and, as a result, the net effect on the structural characteristics of the as-deposited film is not as significant.

Returning to FIG. 2, in some aspects of the invention Step 12 includes depositing the microcrystalline film by a PECVD process using a SiH$_4$ and H$_2$ gas mixture. Step 12 also includes depositing the microcrystalline film at a power level of approximately 0.16783 W per cm$^2$, at a temperature of approximately 320° C., a total pressure of approximately 1.2 Torr, a flow rate of SiH$_4$ to H$_2$ of approximately 100:1.

Alternately, Step 12 includes depositing microcrystalline film through a process selected from the group consisting of low pressure chemical vapor deposition (LPCVD), ultra-high vacuum CVD, and hotwire CVD, although PECVD is the preferred method. Regardless of the deposition method, Step 12 includes depositing microcrystalline film through chemistries selected from the group consisting of disilane ($Si_2H_6$), higher silanes represented by the formula $Si_NH_{2N+2}$, where N is greater than 2, and combinations of silane/fluorosilane chemistries represented by the structural formula $Si_NH_{2N+2}/Si_MF_{2M+2}$, where N and M are greater than, or equal to, 1. M and N need not be equal.

As noted above, favorable results occur when Step 12 includes a microcrystalline film deposition rate of less than 2 Å per second (Å/s). More specifically, Step 12 includes depositing the microcrystalline film with the PECVD method. The deposition conditions include a deposition rate of less than 20 Å/s and a deposition temperature in the range of approximately 100 to 400 degrees C. A deposition rate of approximately 4 Å/s and a deposition temperature of about 320 degrees C. has also been found effective. Alternately, Step 12 includes depositing the microcrystalline film with the LPCVD method, and the deposition conditions include a deposition rate of less than 20 Å/s and a deposition temperature of approximately 560 degrees C.

Figure 4:
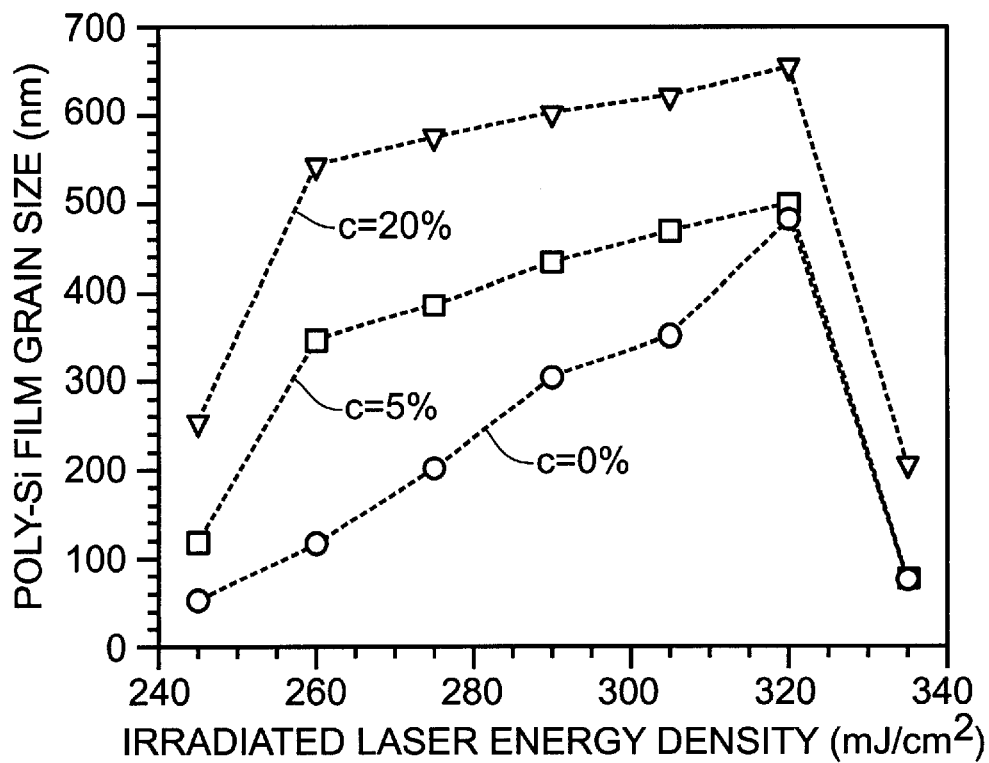
FIG. 4 summarizes the average grain size of polysilicon as a function of the laser energy density and the crystalline content of the film.

Based on the established relationship between microstructure and deposition conditions, one foundation of the present invention is the correlation between as-deposited microstructure and post-ELA-process materials characteristics (i.e. grain size). FIG. 4 summarizes the average grain size of polysilicon as a function of the laser energy density and the crystalline content of the film. The crystalline content of the film is controlled by the deposition rate, as shown in FIG. 1a. Laser annealing is assumed to be performed in vacuum at a substrate temperature of 450° C. FIG. 4 depicts a strong correlation between grain size and deposition rate. Specifically, two dependency regimes can be distinguished: at low energy density values (i.e., <240 mJ/cm$^2$) no significant dependency of the grain size upon the crystalline content is observed. However, at mid-to-high energy density values, a strong correlation between grain size and crystalline content is observed, with the average grain size becoming increasingly larger as the crystalline content increases (i.e., when the film is deposited at a lower deposition rate).

The following explanation is relevant to the results of FIG. 4. When as-deposited film has no embedded crystallites (c=0%), the maximum achievable grain size is about 460 nm at a laser energy density of about 320 mJ/cm$^2$. Depositions of the film in microcrystalline phase (c=5%) improves the grain size of the polysilicon film at a much lower energy density (about 280–290 mJ/cm$^2$). At the same time, the variability of the grain size to changes in the input laser energy is far superior for microcrystalline film, due to the controlled nucleation process inherent with the use of embedded seeds. Additional increases in grain size can be achieved by optimizing the pre-anneal crystalline content in the film (c=20%). Depending upon the microcrystalline content in the pre-annealed film and the selected energy density, the grain size of the post-annealed film can increase by at least a factor of 2–3 when compared to a amorphous silicon precursor.

One important prediction of this model relates to the optimum laser energy density as a function of the as-deposited microstructure. At the same energy density, microcrystalline material tends to develop a larger grain size than amorphous material. Alternatively, this can be thought of as analogous to a smaller laser energy requirement to achieve the same quality characteristic (for example, a grain size of about 340 nm requires 310 mJ/cm$^2$ when the film is deposited at 10 Å/s, but only 250 mJ/cm$^2$ if the film is deposited at 2 Å/s). Therefore, the optimum energy density level (maximizing the grain size) is smaller for microcrystalline films than for amorphous films. The result is important, since reduction of the operating laser energy density decreases substrate damage and equipment stress and use.

Returning to FIG. 2, and in light of the above discussion, Step 14b includes selectively melting microcrystallites, leaving a second density of microcrystallites in the amorphous matter unmelted, whereby a controlled number of seed crystals are established as nucleation sites. In some aspects of the invention, a first surface is provided, such as a transparent substrate. Step 12 deposits the microcrystalline film over the first surface. The microcrystalline film has a first region adjacent and overlying the first surface, and Step 14b selectively melts the microcrystalline film so that the second density of microcrystallites is primarily in the first region adjacent the first surface. That is, microcrystallites are melted during annealing in response to their size, but also in response to their location. Since similarly sized microcrystallites are less likely to melt when further away from the heat source, the microcrystallites adjacent the transparent substrate are more likely to survive annealing and act as nucleation sites. That is, the distance of the microcrystallite from the heat source, or the proximity of the microcrystallite to a cooler substrate, are also factors in determining how a microcrystallite melts.

Figure 5:
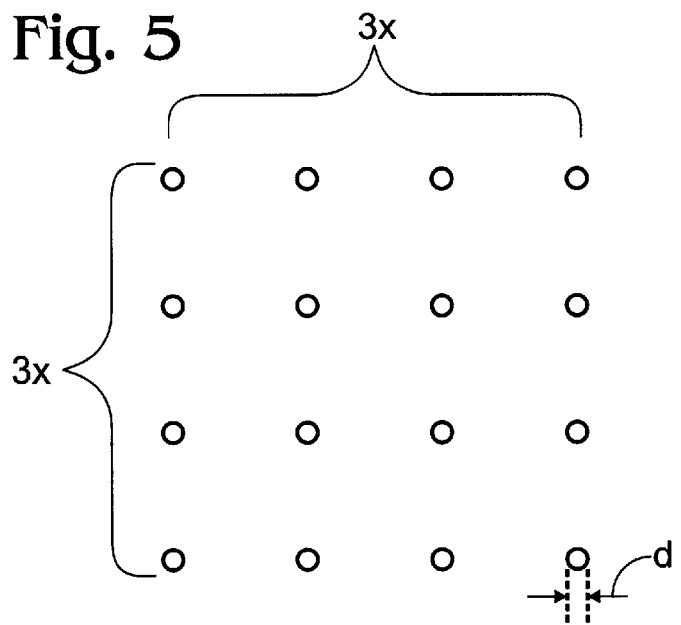
FIG. 5 illustrates the placement of microcrystallites in amorphous matter, in a single dimension.

FIG. 5 illustrates the placement of microcrystallites in amorphous matter, in a single dimension. Each microcrystallite is separated by a distance "x". With respect to the 16 microcrystallites shown, the areal density of crystallites is represented as $16/9x^2$. In general the formula is:

$$n^2/(n-1)^2x^2, \text{ where n is the number of microcrystallites.}$$

As n approaches infinity, the formula becomes:

$$1/x^2.$$

As for the crystallite size, it can be assumed that the crystallites are cylindrical in shape with a diameter "d" and a height "f·t" (where t is the film thickness and f is a number between 0 and 1). So that the volume is:

$$V = (n \cdot d^2/4)(f \cdot t).$$

In a block having the dimension of (n×n), or $n^2$, where n is a dimension of length, such as centimeters. The following relationships can be calculated:

| | |
|---|---|
| total volume | $n^2 \cdot t$; |
| total number of crystallites | $n^2/x^2$; |
| volume of crystallites | $(n^2/x^2)(n \cdot d^2/4)(f \cdot t)$; and |
| crystalline fraction | $[(n^2/x^2)(n \cdot d^2/4)(f \cdot t)]/n^2 \cdot t$ |
| | $= 0.8 \, (f \cdot d^2/x^2)$ |
| | $\approx d^2/x^2$ |

Some of the most critical factors in the present invention method involve crystalline fraction, crystalline density and average crystalline size after the melting. They are called the post-melt or second crystalline fraction, post-melt or second microcrystallite density, and post-melt or second microcrystallite size. The second crystalline fraction is not necessarily the same as the first (pre-melt or as-deposited) crystalline density. Likewise, second density, is not necessarily the same as the first (as-deposited or pre-melt) density. Further, the second size is not necessarily the same as the first (as-deposited or pre-melt) microcrystalline size. The present invention develops a relationship between the pre-melt crystallite conditions and the polycrystalline grain size and grain uniformity.

For example, if the first microcrystallite size is large, greater than 300 Å, but the density is small, most microcrystallites will survive the melting phase of annealing. Because the crystallites are sparsely placed, the grain size of the resulting polysilicon film will be large. However, if the microcrystallites are too widely spaced, the polycrystalline grain size becomes limited due to the phenomena of lateral growth. That is, small grains spontaneously nucleate between growing grains emanating from microcrystallite nucleation sites before they have a chance to coalesce. If the first crystallite grain size is small (less than 150 Å), then a large number of microcrystallites will be annihilated during the melting phase. A large first density is required to provide a sufficiently large second density.

It is estimated that the melting rate of amorphous silicon is approximately 6 Å per nanosecond (ns), or (6 Å/ns). The melting rate ($u_m$) of microcrystallite silicon is estimated to be (3 Å/ns). The melting time ($t_m$) is the length of time that matter stays at the melting temperature. Therefore, the melt "length" ($l_m$) of microcrystallites is:

$$l_m = u_m * t_m.$$

If the size (d) of the microcrystallites is less than $l_m$, the microcrystallite will probably melt.

Figure 6:
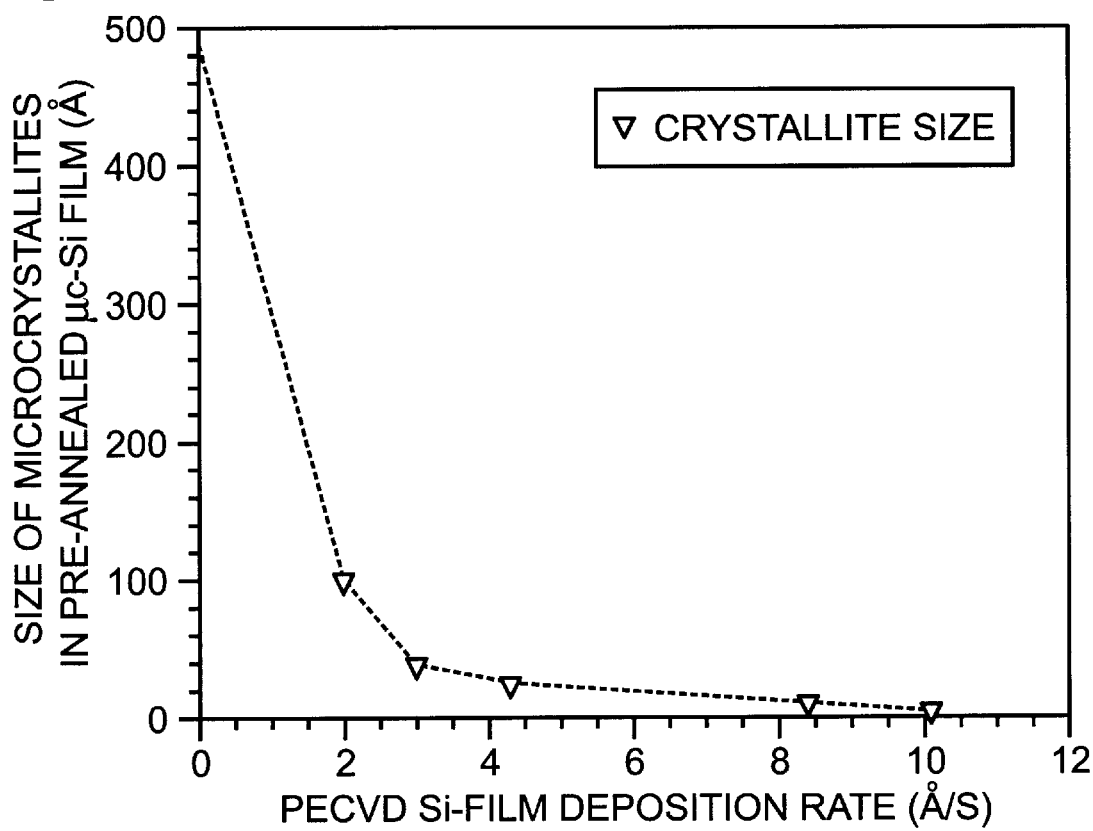
FIG. 6 illustrates the relationship between microcrystallite size and deposition rate, of silicon films deposited by PECVD.

FIG. 6 illustrates the relationship between microcrystallite size and deposition rate, of silicon films deposited by PECVD. The size of the crystallites in a PECVD microcrystalline silicon film decreases as the deposition rate of the film increases. The dependency between crystallite size and deposition rate is highly non-linear, as illustrated in FIG. 6. To achieve crystallite size larger than 100 Å, deposition rates lower than about 2 Å per second are required. Below the deposition rate of 2 Å per second, small changes in rate can result in large changes in the crystalline size. Above 4 Å per second, the crystallite size is only marginally responsive to changes in deposition rate. Thus, the preferable range of operation is below 4 Å per second. Then, crystallites are obtained with an average size of 500 Å, or larger.

The critical ($d_{crit}$)size, below which the microcrystallite will likely melt is:

$$d_{crit} \approx l_m = u_m * t_m = 3*(50 \text{ to } 100 \text{ ns}) = 150 \text{ to } 300 \text{ Å}.$$

The crystallite density ($N_c$) is a function of the average separation between microcrystallites. As shown above, $N_c \approx 1/x^2$. The minimum separation is limited by the size of the microcrystallites, so that x must be greater than d.

Figure 7A:
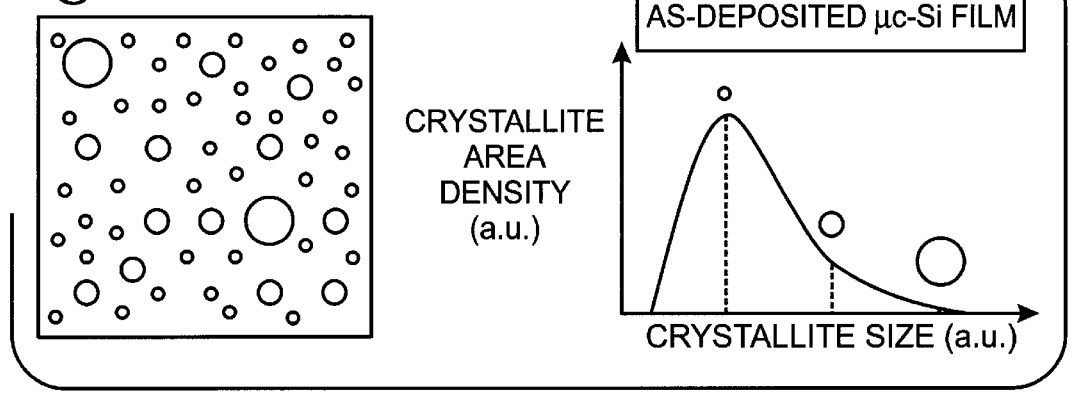
FIGS. 7a–7c illustrate examples of the relationship between post-melt density and pre-melt crystallite size.
Figure 7B:
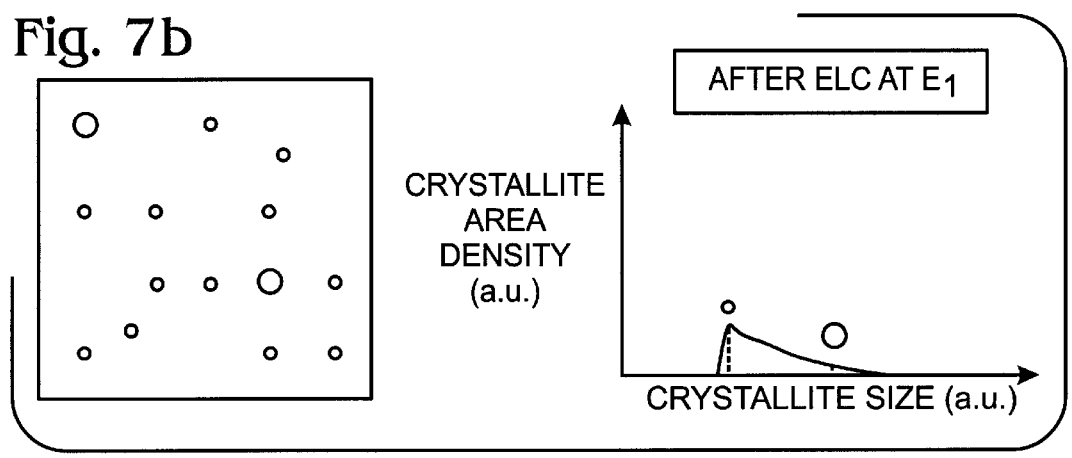
Figure 7C:
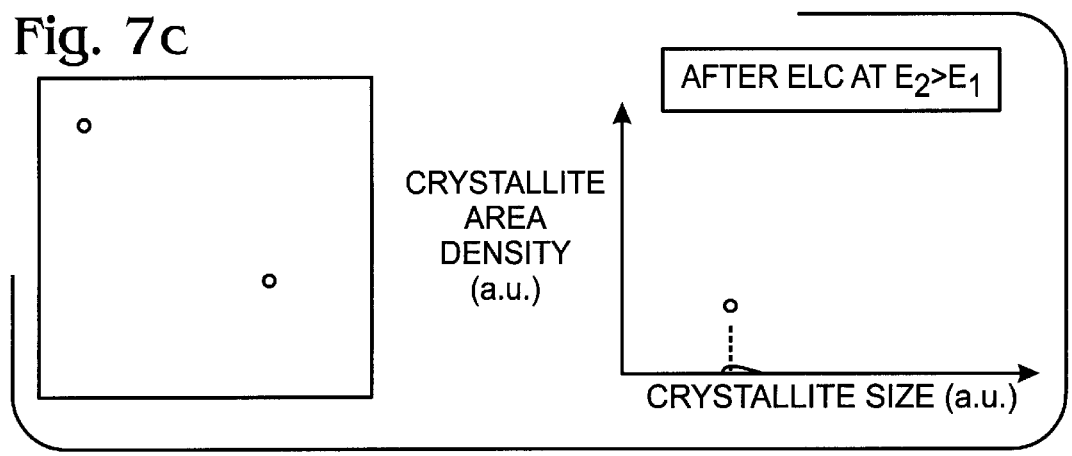

The function of the first microcrystallite size is also a factor in the determination of the post-melt crystal fraction, density, and size, and, ultimately, to the polycrystalline grain size. FIGS. 7a–7c illustrate examples of the relationship between post-melt density and pre-melt crystallite size. Typically, crystallites are formed so that the largest number of same sized microcrystallites are the average, or average first microcrystallite size. The crystallite peak, the crystallite size having the maximum number crystallites, is the average value. The crystallite sizes are distributed in a natural log function following the peak. Returning briefly to FIG. 2, Step 12 includes forming microcrystallites having an average size which is the first microcrystallite size, and a size distribution function around the average size. As represented in FIGS. 7a–7c, the width of the size function, commonly measured as a full width half maximum (FWHM), is an indication of how consistent the microcrystallites are in size. Regardless of the FWHM, the size distribution dictates that most the crystallite sizes are smaller than the average size. The creation of the proper first density and first size is of critical importance, and highly dependent on the deposition methods and deposition rates.

FIGS. 7a–7c illustrate the distribution of microcrystallites following the melting phase of annealing. The average size of the crystallites has been reduced following the melting phase, and most of the crystallites smaller than the average size have been annihilated. For this example the critical value of microcrystallite size is approximately the same as the average value. However, the average and critical sizes need not be the same. Knowing the first density and first crystallite size, the second, post-melt density can be calculated.

Figure 8:
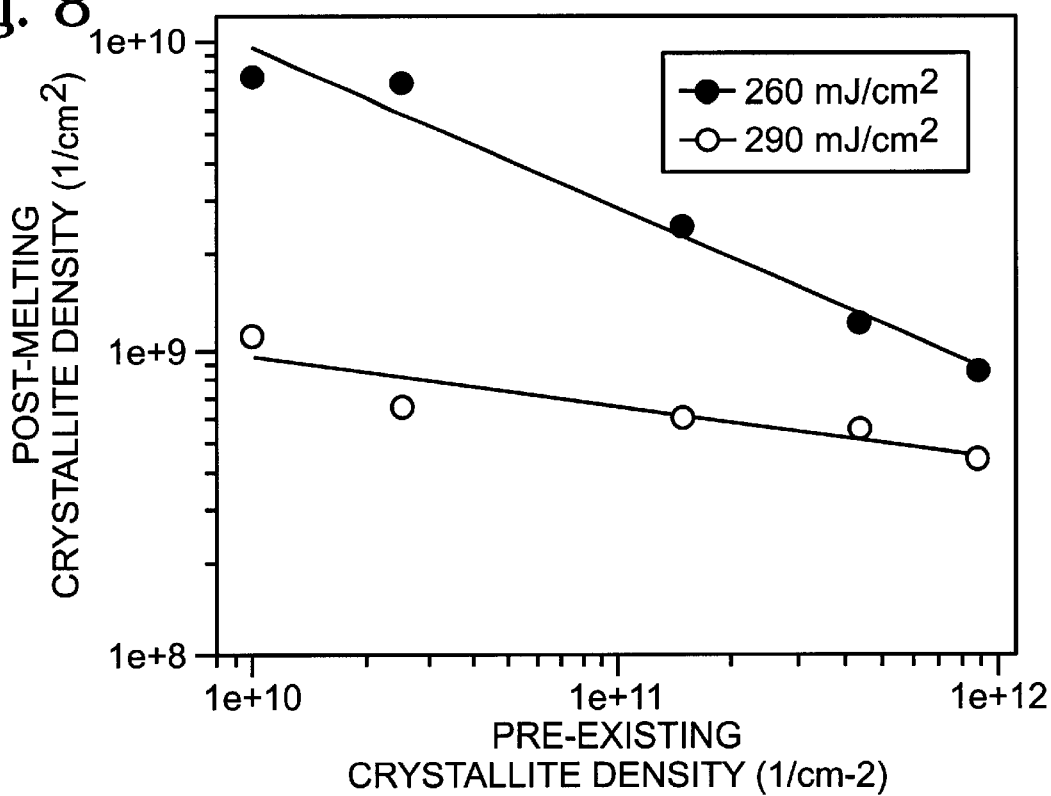
FIG. 8 illustrates the relationship between pre-melt and post-melt density as a function of the applied laser energy density.

FIG. 8 illustrates the relationship between pre-melt and post-melt density as a function of the applied laser energy density. The post-melting crystallite density depends upon both the pre-existing crystallite size and density, as well as the applied laser energy density. Recent studies have revealed that a post-melting crystalline density of about $1 \times 10^8$ cm$^{-2}$ to be in the optimal range. As FIG. 8 illustrates, there are alternate methods for reaching the above-stated objective. Either a low density of large microcrystallites, or high density of small crystallites will work. Higher laser energy densities eliminate a larger fraction of crystallites, leaving fewer crystallization sites after the melting phase of the annealing process. With PECVD silicon material, a higher density of crystallites is associated with a smaller crystallite size. Even though the pre-melting density is high, more crystallites are melted during ELC due to their smaller size.

Returning to FIG. 2, Step 14b includes forming microcrystallites having a second microcrystallite size and second microcrystallite density. The second microcrystallite size and density result from the annihilation of microcrystallites smaller than a microcrystallite critical size, and the partial melting of microcrystallites having a pre-melt size larger than the critical size. Step 14b also includes forming a second crystalline fraction which is a product of the second microcrystallite size and second microcrystallite density. Likewise, Step 14b includes the second microcrystallite size being the average microcrystallite size after melting. The microcrystalline sizes are formed in a second distribution function around the average second microcrystallite size, whereby the density of microcrystallites is reduced. The comparison of FIGS. 7a–7c illustrate that the number and distribution of nucleation sites changes during annealing. The number of smaller-than-average microcrystallites is typically reduced in the melting phase, as shown in the comparison of FIGS. 7a–7c, unless the critical size is less the first average size.

Returning to FIG. 2, in some aspects of the invention, Step 12 includes a first percentage of microcrystallites having a size less than the average, first microcrystalline size. Then, Step 14b includes a second percentage of microcrystallites having a size less than the average, second microcrystallite size. Generally, the first percentage is larger than the second percentage. In this manner, the annihilation of small microcrystallites makes the second microcrystallite density responsive to the first microcrystallite size distribution function.

As noted above and shown in FIG. 7a, most microcrystallites are smaller than the first average microcrystallite size. Returning to FIG. 2, Step 12 includes the first microcrystallite size distribution function being asymmetrical, with a larger number of microcrystallites which are smaller than the average, first microcrystallite size, than are larger than the average first microcrystallite size. In this manner, the asymmetrical deposition of microcrystalline sizes in Step 12 and the melting of smaller microcrystallites in Step 14b act to regulate the density of nucleation sites.

Table 1 illustrates the process of calculating the first polycrystalline grain size and first grain uniformity from the above-mentioned variables of microcrystallite size, density, crystalline fraction, and laser energy density. The first crystalline fraction is fixed at 20%, the first average microcrystallite size is approximately 300 Å, distributed lognormally as in FIG. 7a, and the first density is $5.55 \times 10^{10}$ cm$^{-2}$.

TABLE I

| ELA Density mJ/cm$^2$ | $t_m$ (ns) | $l_m$ (Å) | $N_c$ post-melt $10^{10}$ | x post-melt (Å) | $t_s$ (ns) | $l_g$, max (Å) | $g_s$ (Å) |
|---|---|---|---|---|---|---|---|
| 280 | 50 | 150 | 5.42 | 430 | 50 | 1500 | 430 |
| 300 | 100 | 300 | 4.41 | 480 | 100 | 3000 | 480 |
| 320 | 200 | 600 | 1.51 | 820 | 200 | 6000 | 820 |
| 350 | 400 | 1200 | 0.14 | 2690 | 400 | 12000 | 2690 |

The melt length ($l_m$) is a product of the melting time ($t_m$) and the melting rate of 3 Å per ns. The post-melt separation between microcrystallites is represented by x. The solidification time (which equals $t_m$) is $t_s$, $l_g$ max represents the maximum lateral growth length, the product of the solidification time and the solidification velocity of approximately 30 Å per ns, and $g_s$ is the grain size of the polycrystalline film, defined as the minimum value between post-melt separation distance x and the maximum lateral growth length $l_g$ max. The largest polycrystalline grains (2690 Å) will be formed at an energy density of 350 when the first density is 20% and the average first crystallite size is 300 Å, and is distributed lognormally in a fashion similar to FIG. 7a. The data support the position that even larger polycrystalline crystal grains could be formed at higher ELA densities. The above analysis does not take into account the limitations imposed in forming the polycrystalline film over a transparent substrate, such as glass, quartz, or plastic.

Returning to FIG. 2, Step 14 includes using an excimer laser crystallization (ELC) process, having a wavelength of approximately 308 nm, or less, to melt the amorphous matter and selectively melt the microcrystallites. More specifically, Step b) includes the ELC process having an energy density. The second crystalline fraction is responsive to the ELC energy density and the first crystalline fraction of Step 12.

As shown above, there is a demonstrable relationship between the first and second crystalline fractions. Step 16 includes forming polycrystalline grains in response to the second microcrystallite density and second microcrystallite size. More specifically, Step 16 includes the polycrystalline grains forming at a lateral growth length responsive the amorphous matter solidification rate. Then, Step 16 includes the polycrystalline grain size and uniformity being responsive to the second microcrystallite density and the lateral growth rate. In this manner, grain size has a minimum size determined by the spacing between microcrystallite nucleation sites, and a maximum size determined by the lateral growth rate.

Table II is an example of the present invention method at a first crystalline fraction of 2.5%, first crystallite size of 200 Å, and a first density of $1.562 \times 10^{10}$ cm$^{-2}$.

TABLE II

| ELA Density mJ/cm$^2$ | $t_m$ (ns) | $l_m$ (Å) | $N_c$ post-melt $10^{10}$ | x post-melt (Å) | $t_s$ (ns) | $l_g$, max (Å) | $g_s$ (Å) |
|---|---|---|---|---|---|---|---|
| 280 | 50 | 150 | 1.17 | 920 | 50 | 1500 | 920 |
| 300 | 100 | 300 | .763 | 1150 | 100 | 3000 | 1150 |
| 320 | 200 | 600 | .0187 | 7310 | 200 | 6000 | 6000 |
| 350 | — | — | — | — | — | — | — |

When the ELA density is 320 mJ/cm$^2$, the maximum polycrystalline first grain size of 6000 Å is equal to the lateral growth rate of 6000 Å. That is, the optimal size and uniformity have been reached. At larger energy densities, the space between microcrystallites increases and permits the possibility of nucleating small grains between the grains formed from the crystallite nucleation sites. Another good measure of polycrystalline grain quality is electron mobility. In some aspects of the invention, the TFT using the present invention polycrystalline film has an electron mobility of greater than 150 cm$^2$/Vs, and threshold voltage of less than 2 volts is formed. To achieve this electrical performance the polycrystalline grain size is approximately 0.5 to 1 micron, while the uniformity between grain size is better (less) than 10%.

Figure 9:
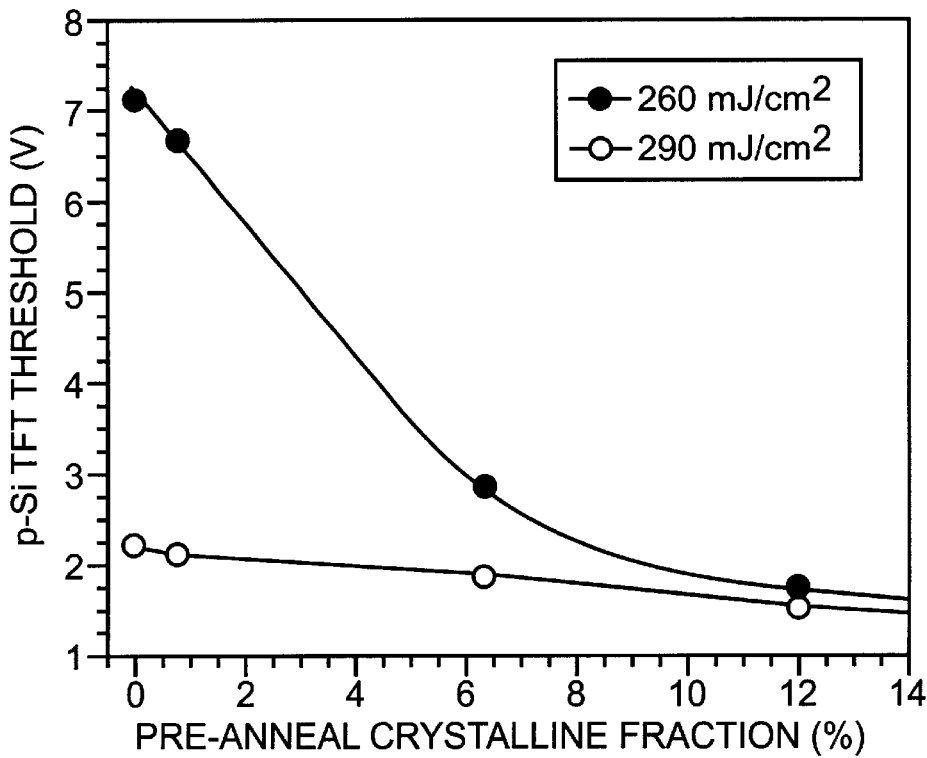
FIGS. 9 and 10 illustrate the relationship between crystalline fraction, energy density, and either electron mobility or threshold voltage.
Figure 10:
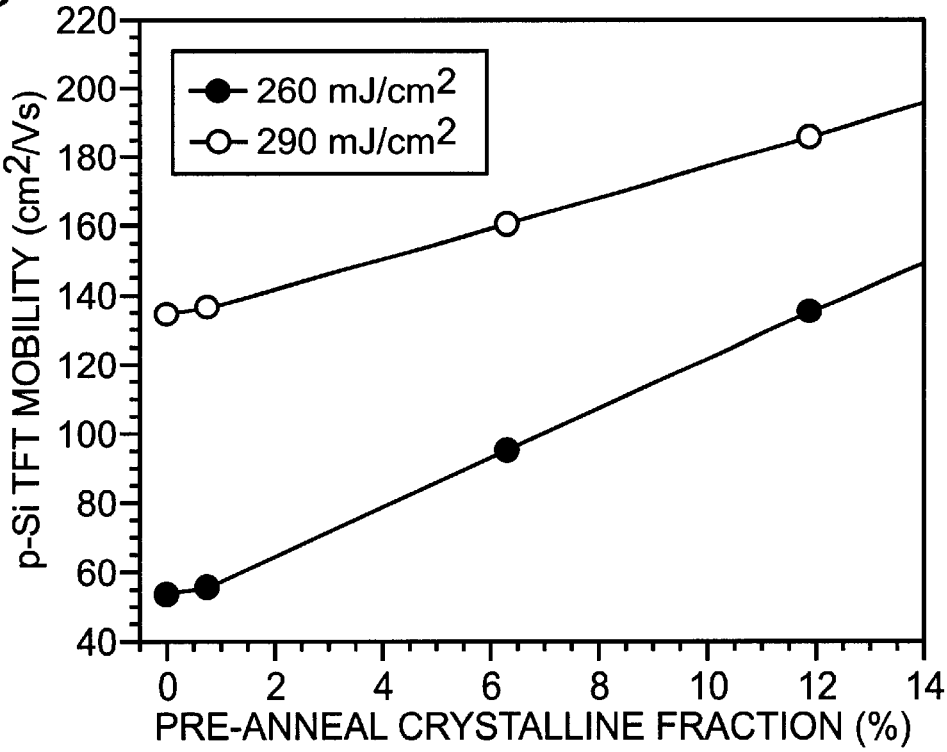

FIGS. 9 and 10 illustrate the relationship between crystalline fraction, energy density, and either electron mobility or threshold voltage. The performance of a TFT device, using the present invention polycrystalline film, is markedly different with regard to electron mobility increases and threshold voltage decreases by employing the microcrystalline silicon precursor at various degrees of crystalline fraction. The performance improvement is more significant at lower levels of laser energy density. These results indicate equivalent microcrystallite precursor performance can be achieved at lower levels of laser energy density.

From Tables I and II it can be seen that the distance between crystallites is typically orders of magnitude larger than the crystallite size. Therefore, following the melting phase, the size and size distribution of crystallites is not as critical as the post-melt density. Pre-melt size and size distribution, however, are critical in the determination of the final polycrystalline grain size.

Returning to FIG. 2, Step 12 includes forming a first microcrystallite crystalline fraction which is a product of the first microcrystallite size and the first microcrystallite density. The first crystalline fraction in the range of approximately 0.01 to 80%. More useful ranges are more probably in the range of approximately 0.01 to 25%, and 0.01 and 15%. Even more ideal is the range between approximately 0.01 and 5%. The 0.01 to 5% range, with a sufficiently large crystallite size, necessarily means the differences between the first and second crystalline fraction, density, and sizes are minimized. This minimizes uncertainties in the process between pre and post-melting. Even more critically, the ELA energy density could be reduced, simplifying and speeding the process, and limiting stress to the glass, since only a limited number of microcrystallites need be melted.

Figure 11:
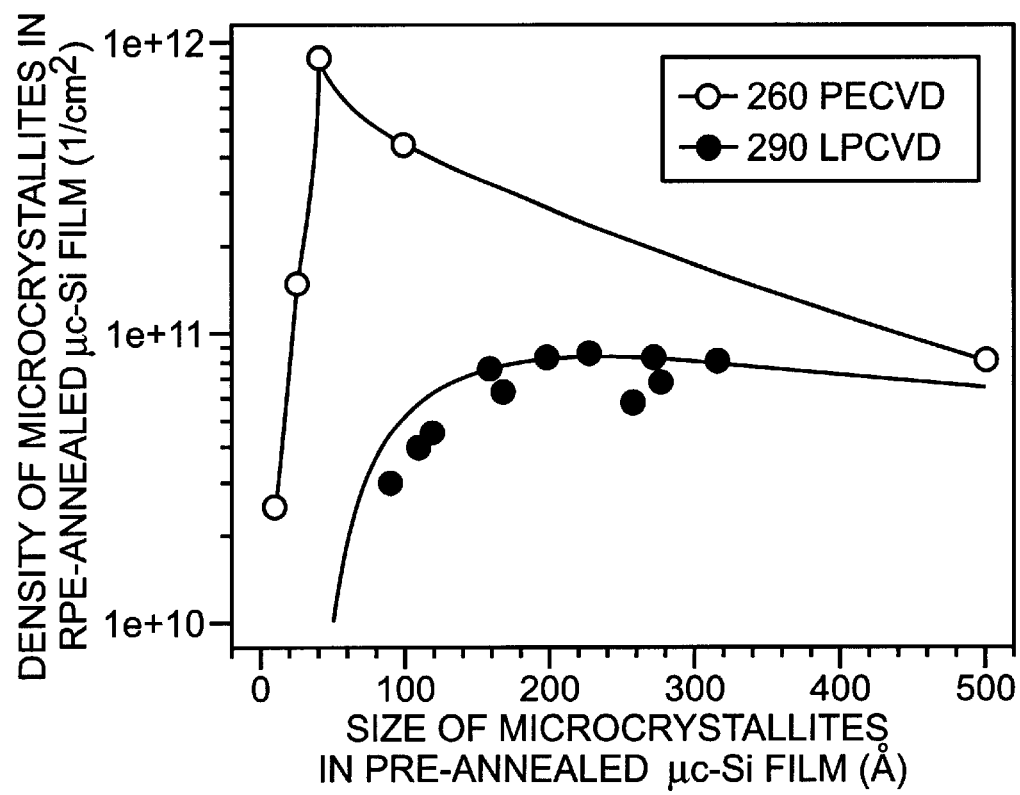
FIG. 11 illustrates the relationship between microcrystallite size and microcrystallite density in PECVD and LPCVD silicon films.

FIG. 11 illustrates the relationship between microcrystallite size and microcrystallite density in PECVD and LPCVD silicon films. The density of pre-existing microcrystallites demonstrates a non-monotone behavior with respect to the crystallite size. This behavior is the result of the competition between the incoming rate of atoms from the gas phase during film deposition, and the surface diffusion rate of these atoms. When the incoming rate is comparable to the surface diffusion rate, many crystallites of a small size are formed. This is the case of the deposition rate being between 2–10 Å/s. When the surface diffusion rate becomes larger than the incoming rate, a low density of large sized crystallites forms. This is the case of the deposition rate of less than 2 Å/s. Regardless, it can be seen that the deposition parameters, by affecting incoming rate and surface diffusion rate, are used to regulate the size and density of crystal grains.

Returning to FIG. 2, in some aspects of the invention, Step 14 includes forming microcrystallites having a size less than approximately 1000 Å. The range of approximately 150 to 300 Å is typically above the critical size that survives the melting phase of most annealing processes. Preferably, Step 14b includes the microcrystallite second density being greater than, or equal to approximately $1 \times 10^8$ microcrystallites per $cm^2$, with approximately a 1 micron average separation between microcrystallites.

Figure 12:
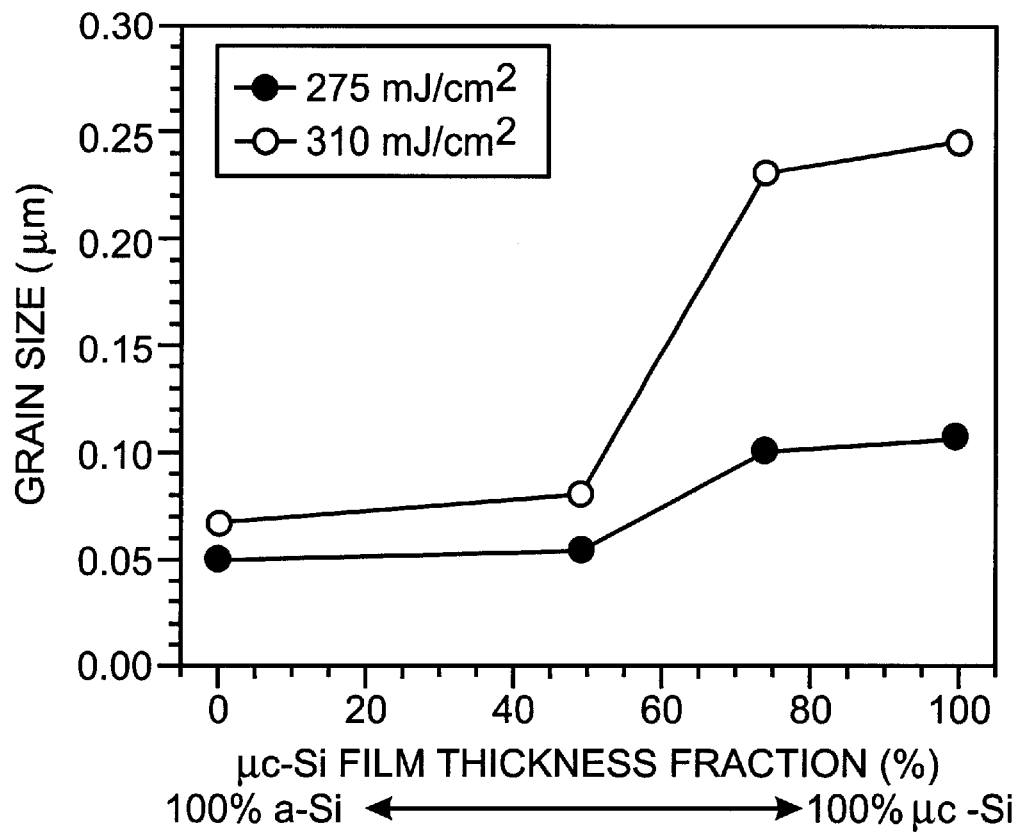
FIG. 12 illustrates the results of the deposition of double-layers.

One apparent drawback associated with a lower amorphous silicon deposition rate is a reduced throughput, or increased process time. The deposition of double-layers of microcrystalline film, or microcrystalline and amorphous film, is a solution. For example, where one of the layers is deposited in the microcrystalline phase (low deposition rate) and the other layer is deposited at standard conditions. The total thickness of the double-layer film is typically about 50 nanometers (nm). It is desirable to minimize the total thickness of the microcrystalline layer required for achieving the observed grain size amplification, to optimize transistor performance characteristics. FIG. 12 illustrates the results of the deposition of double-layers. As shown, at the optimum energy density level, a thickness of at least 37.5 nm (75% of the total thickness) was required for the microcrystalline film. When the thickness was reduced below that level, a complete loss of the benefit was experienced.

Returning to FIG. 2, Step 12 includes depositing a second, amorphous matter film, overlying the first, microcrystalline film. Step 14 includes melting the second film and, at least partially, melting the first film, whereby a controlled density and size of seed crystals in the first film helps regulate the formation of crystal grains in the second film.

More specifically, Step 12 includes forming the first density of microcrystallites in the first film and forming a third density of microcrystallites, less than the first density, in the second film. Step 14 includes melting a number of microcrystallites in the first film to form a second density of microcrystallites, and selectively melting a number of microcrystallites in the second film to form a fourth density of microcrystallites, less than the second density. Then, Step 16 includes forming polycrystalline grains in the first and second films primarily in response to nucleation sites in the first film. In this manner, a controlled number of microcrystallite seed crystals in the first film are used as nucleation sites for both the first and second films.

Step 12 includes the first and second films having thicknesses, with the first film thickness being at least approximately 100 Å and the second film thickness being less than approximately 900 Å. Typically, the second thickness is less than 300 Å. Transistor junction regions with a total thickness of less than 400 Å are preferred in the interest of high switching speeds.

In some aspects of the invention, Step 12 includes forming a microcrystalline film embedded with microcrystallites having a predetermined first crystallographic orientation. Then, Step 16 includes forming polycrystalline film to have the first crystallographic orientation of the microcrystallites formed in Step 12. In this manner, the use of a common crystallographic orientation results in a greater charge transfer between grain boundaries than a random crystallographic orientation. Typically, the first crystallographic orientation of the embedded microcrystallites is selected from the group consisting of (110) and (111).

In some aspects of the invention, Step 14 includes heating the microcrystalline film formed in Step 12 to selectively annihilate microcrystallites not having the first crystallographic orientation. Then, Step 16 includes forming a polycrystalline film having the first crystallographic orientation of the surviving microcrystallites.

The present invention method described above has been explained in the context of a one-shot laser annealing process. Typically, commercial laser equipment has a shot duration of either 30 or 220 ns. The present invention process is not necessarily limited to these values. The present invention process can likely be enacted with laser shot pulse widths of from approximately 1 ns to 1000 ns. It is also understood that the melting time is not necessarily related to the laser shot duration, as the annealed matter typically remains molten for a period of time after the laser shot has ended.

Typically, matter is crystallized through a series of laser shots. The first shot is more critical in that typically all the amorphous matter is made molten, and typically all the matter is crystallized upon cooling and solidification. Subsequent laser shots cure the polycrystalline film of defects. Typically, the energy density is such that only small crystal grains, or defects in large crystal grains are annihilated. Therefore, the method includes a cycling through Steps b1), b2), b3), and c) a plurality of times. The first cycle includes melting substantially all of the amorphous matter in Step 14b and forming substantially all the crystal grains in Step 16. The following cycles of Step 14b melt small crystal grains and defects in the crystal grains to form more uniformly sized crystal grains in the subsequent cycles of Step 16.

A laser annealing process is generally preferred because the high energy densities permit local temperatures in the microcrystalline that are high enough the melt the film, but such a short duration that the underlying transparent substrate can be minimally stressed. However, the present method invention is potentially realizable with other annealing methods. With proper pre-heat and ramp-up temperatures, a rapid thermal annealing (RTA) process may be used. Then, Step 14 includes RTA process using a temperature below approximately 800° C. for a duration generally in the range between 1 and 600 seconds. Typically, the time duration is less than 2 minutes.

The quality of the microcrystalline film has been explained above largely with respect to microcrystallite size and density. However, alternate means are available to describe the as-deposited microcrystalline film. In some aspects of the invention, Step 12 includes forming a microcrystalline film having an optical gap of approximately 1.8 eV, or larger. The preferred optical gap is in the range of approximately 1.8 to 2.2 eV. Alternately, Step 12 includes forming a microcrystalline film having the center of the transverse-optical phonon Raman peak (TO-peak) at a wave-number greater than approximately 470 $cm^{-1}$ and a full-width half maximum (FWHM) value of less than 70 $cm^{-1}$. The preferred values are a wave-number of approximately 470 to 510 $cm^{-1}$, and an FWHM of approximately 15 to 70 $cm^{-1}$.

Figure 13:
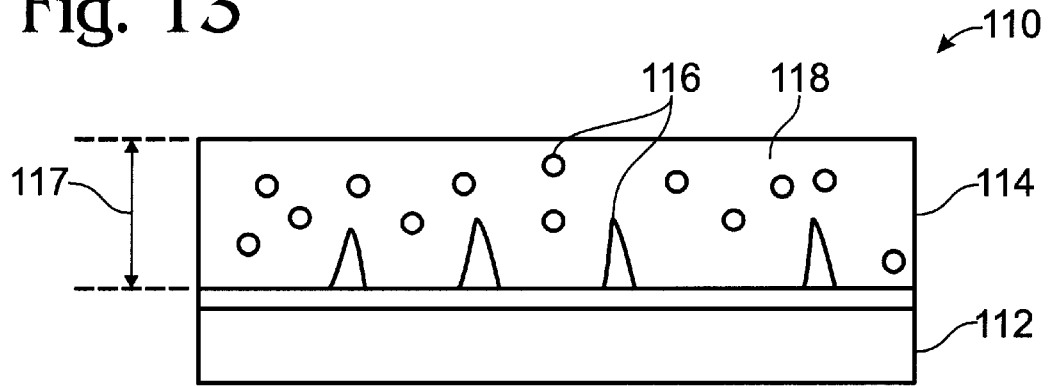
FIGS. 13–16 illustrate steps in a method of forming an LCD.

FIGS. 13–16 illustrate steps in a method of forming an LCD 110. Ultimately, LCD 110 of FIG. 13 comprises a transparent substrate 112, and a polycrystalline semiconductor film (see FIG. 16) overlying substrate 112. Typically, substrate 112 is selected from the group consisting of quartz, glass, and plastic. The polycrystalline film is formed from depositing amorphous matter on substrate 112 in deposition conditions which result in the formation of microcrystalline film 114 having a first crystalline fraction. Microcrystalline film 114 includes amorphous matter 115 embedded with microcrystallites, or small seed crystals 116. The first crystalline fraction is defined from the first microcrystallite density and size, as described above. FIG. 13 depicts a plurality of microcrystallites 116 suspended in amorphous matter 115, represented as spheres, and a plurality of microcrystallites 116 located in film 114 adjacent transparent substrate 112, or directly adjacent the barrier layer separating film 114 from transparent substrate 112. Microcrystallites 116 located in the adjacent layer of film 114 have been given a spike shape to differentiate them from the spherically represented microcrystallites 116 that are suspended in film 114. In some aspects of the invention, only microcrystallites 116 in the adjacent layer of film 114, microcrystallites 116 represented as spikes, are present in film 114.

Microcrystalline film 114 has a thickness 117. Typically, a barrier layer separates substrate 112 from film 114. In the process of making LCD 110, TFT devices (not shown) are formed from film 114. The deposition conditions are controlled to encourage the formation of uniform crystal grains having a relatively large size.

In some aspects of the invention, microcrystalline film 114 is deposited by a PECVD process using a $SiH_4$ and $H_2$ gas mixture, at a power level of approximately 0.16783 $W/cm^2$, at a temperature of approximately 320° C., a total pressure of approximately 1.2 Torr, and a $SiH_4$ to $H_2$ flow rate of approximately 100 to 1. Alternately, microcrystalline film 114 is deposited through a process selected from the group consisting of low pressure chemical vapor deposition (LPCVD), ultra-high vacuum CVD, and hot-wire CVD.

In some aspects of the invention, microcrystalline film 114 is deposited through chemistries selected from the group consisting of disilane ($Si_2H_6$), higher silanes represented by the formula $Si_NH_{2N+2}$, where N is greater than 2, and combinations of silane/fluorosilane chemistries represented by the structural formula $Si_NH_{2N+2}/Si_MF_{2M+2}$, where N and M are greater than, or equal to, 1.

It is an aspect of the invention that microcrystalline film 114 is deposited in an ultra-high vacuum environment, whereby the minimization of contaminates enhances the formation of microcrystallite 116. In the presence of contaminants there is a competition for absorption on the surface of the substrate between silicon species and impurities. As a result, the surface mobility of absorbed silicon species is reduced and there is a smaller probability of forming crystalline clusters than in an environment devoid of gaseous impurities. Further, transparent substrate 112 is cleaned before microcrystalline film 114 is deposited, whereby the formation of microcrystallite 116 in microcrystalline film 114 is promoted. Cleaning is accomplished with an in-situ plasma clean using Ar, $O_2$, $N_2$, or $H_2$, or by ex-situ wet cleaning chemistries, or mechanical means (i.e., bead blasting).

Regardless of the deposition method used, the present invention method is effective in deposition conditions which include a deposition rate of less than 2 Å per second (Å/s). Then, a preferred crystalline fraction in the range from 0.01 to 80% is formed. In some aspects of the invention, the preferred crystalline fraction range is narrowed to 0.01 to 25%, or even 0.01 to 5%.

When amorphous matter is deposited by the PECVD method, the deposition rate is less than 10 Å/s and a deposition temperature of approximately 380 degrees C. When amorphous matter is deposited with the LPCVD method, the deposition conditions include a deposition rate of less than 20 Å/s and a deposition temperature of approximately 560 degrees C.

Figure 14:
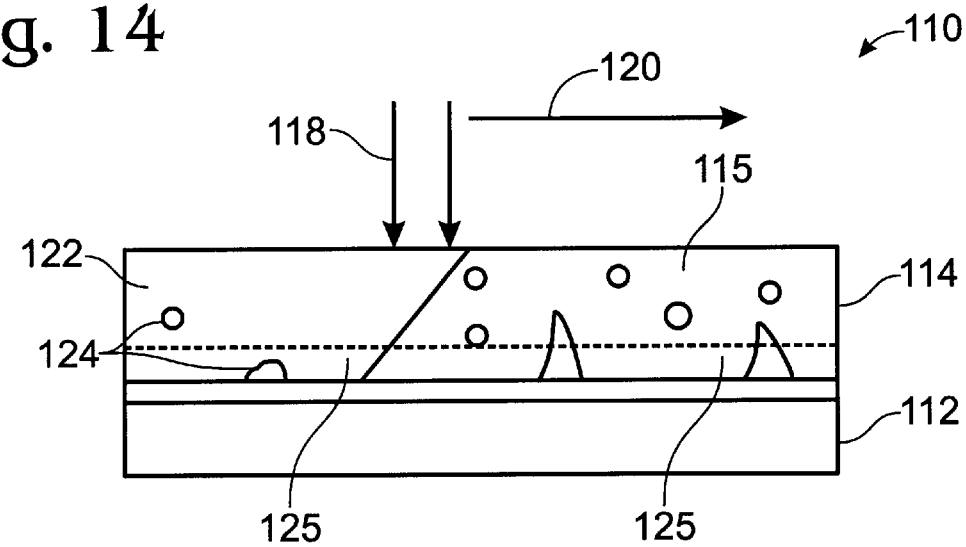
Figure 16:
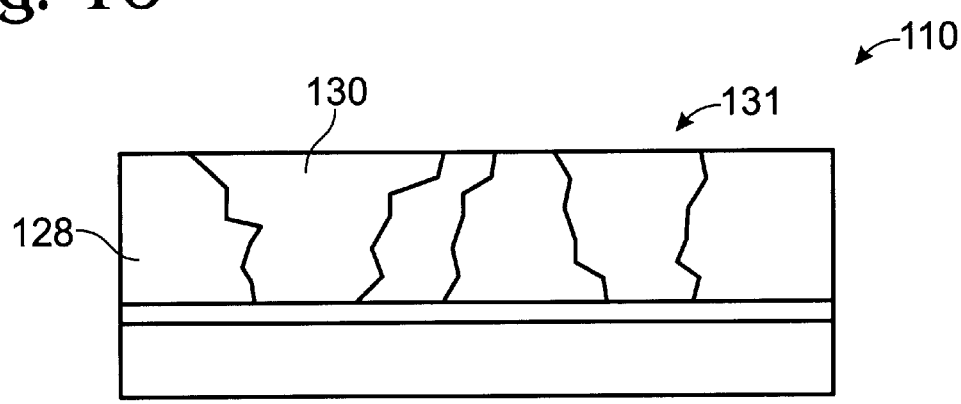

FIG. 14 illustrates the annealing of microcrystalline film 114 to create the polycrystalline TFT film shown in FIG. 16. A series of arrows 118 pointing perpendicular to the surface of film 114 represent light from excimer laser, not shown. Due to the limited aperture size of the laser, it is typical to move laser beams 118 across film surface 114 during annealment. The direction of movement of laser beam 118 is represented by arrow 120 pointing parallel to film 114. The amorphous matter of film 114, with the reference designator 122, is shown melted by laser beam 118. It is also typical for a number of the microcrystallites 116 in melted area 122 to be selectively melted during annealment. Smaller crystallites 116 are annihilated and some microcrystallites 116 are partially melted, leaving unmelted, but smaller microcrystallites 124 embedded in molten amorphous matter 122. As mentioned above, microcrystallites below a critical size are typically melted, although the melting of microcrystallites is also related to the location in the film (distance from heat source).

Remaining microcrystallites 124 are the seed crystals that causes melted area 122 to form into crystal grains. That is, unmelted microcrystallites 124 act as nucleation sites to crystallize the polycrystalline film. It is an aspect of the invention that microcrystalline film 114 is annealed to selectively melt microcrystallites 124 to form a second, post-melt crystalline fraction and second microcrystallite density. The deposition process and annealing process regulate the formation of the second microcrystallite density and crystalline fraction. More specifically, film 114 has a first region 125 adjacent and overlying transparent substrate 112. Annealing selectively melts microcrystalline film 114 so that the second, or post-melt density of microcrystallites are primarily in first region 125 adjacent transparent substrate 112.

Figure 15:
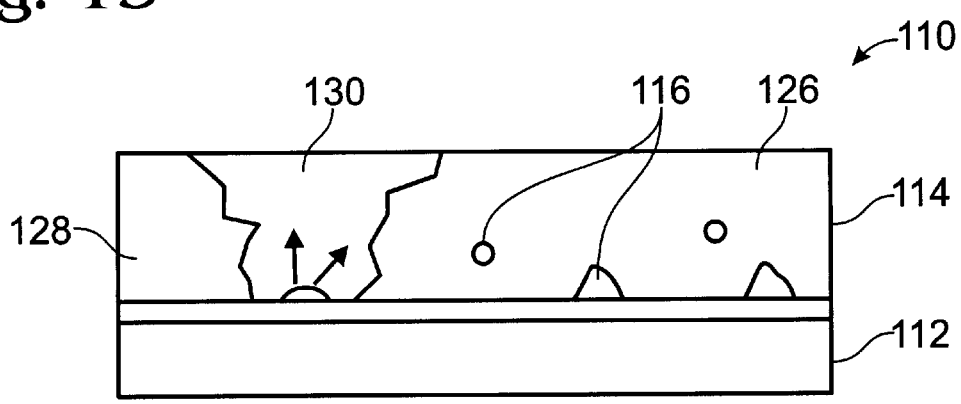

FIG. 15 is LCD 110 of FIG. 14 further in the annealment process that was begun in FIG. 13. Film 114 is cooled so that a crystal grain 128 is formed around a seed crystal, not shown, and film area 130 is crystallizing to form a grain around microcrystallite 124. That is, polycrystalline grain size 128 is responsive to the density of unmelted microcrystallites 124.

FIG. 16 is LCD 110 after annealment. A TFT polycrystalline semiconductor film 131 now overlies transparent substrate 112. Film 131 is composed of areas of large crystal grains, includes grains 128 and 130. Polycrystalline film 131 has an electron mobility of greater than 150 $cm^2/Vs$, a grain size larger than 0.5 microns, and a grain size uniformity of less than 10%. The finished TFT transistor using polycrystalline film 131 has a threshold voltage of less than 2 volts. The inclusion of embedded seed crystals 116 in amorphous matter 115 (see FIG. 13) encourages uniformly sized grain crystals 128–130 having a large grain size. Alternately, the quality of polycrystalline film 131 is expresses in terms of electron mobility. As shown above, the electron mobility of film 131 is responsive to the second microcrystallite density.

Figure 17:
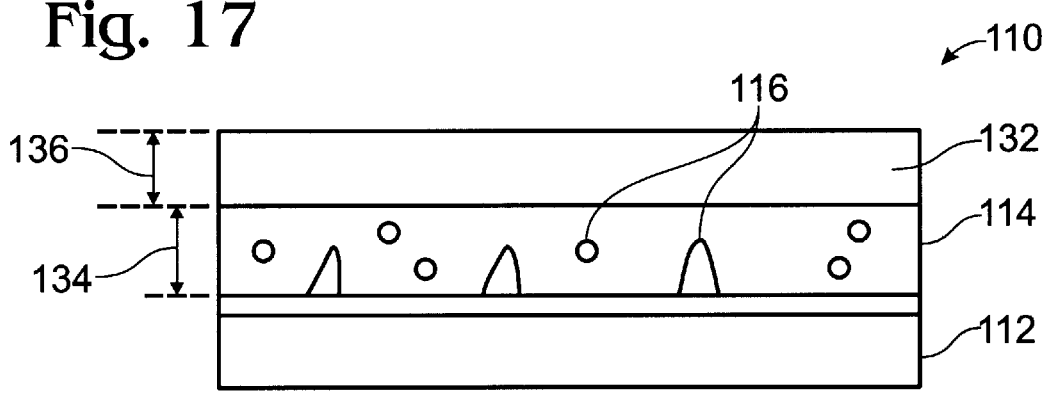
FIG. 17 depicts the LCD of FIG. 13, further comprising a second, amorphous matter film overlying the microcrystalline film.

FIG. 17 depicts LCD 110 of FIG. 13, further comprising a second, amorphous matter film 132 overlying microcrystalline film 114. Film 114 has a thickness 134 and second film 132 has a thickness 136. In some aspects of the invention, second film 132 is completely amorphous material. In other aspects, second film 132 is a microcrystalline film with embedded microcrystallites (not shown). Since there are fewer complications in depositing completely amorphous film 132, the film deposition process is speeded with the use of completely amorphous film 132. That is, the deposition of completely amorphous matter film 132 is faster. The annealing process includes extending crystalline regions from microcrystalline film 114 into second film 132 so that the advantages of using microcrystalline film 114 are utilized. Second film thickness 136 is generally less than approximately 25% of the combined first and second film thicknesses 134 and 136. Practically, first thickness 134 is approximately 100 Å, and second thickness 136 is approximately 900 Å, or less. Preferably, second thickness 136 is approximately 300 Å. The annealing process includes melting second film 132 and, at least partially, melting first film 114. Controlling the size and density of microcrystallites in first film 114 regulates the formation of polycrystalline grains in second film 132. Research is presently continuing to increase second thickness 136 relative to first thickness 134 so as to further quicken the deposition process.

Figure 18:
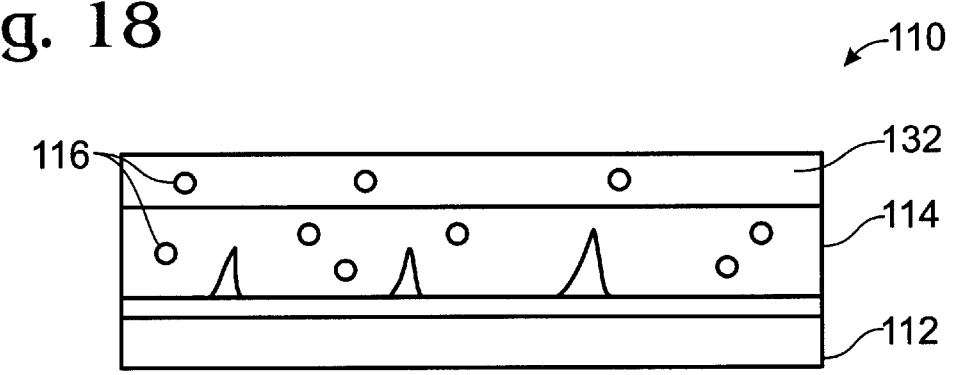
FIG. 18 depicts the LCD of FIG. 17 where the second film is specifically a microcrystalline film.

FIG. 18 depicts LCD 110 of FIG. 17 where second film 132 is specifically a microcrystalline film. A first density of microcrystallites 116 are formed in first film 114, and a third density of microcrystallites are formed in second film 132. The third density is less than the first density.

Figure 19:
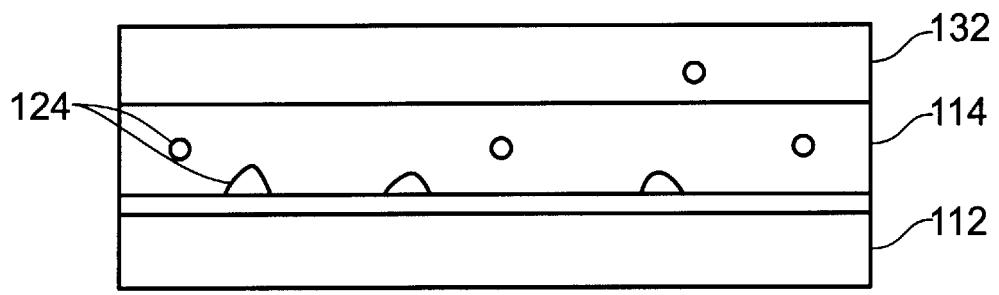
FIG. 19 depicts the LCD of FIG. 18 following the melting phase of annealment.

FIG. 19 depicts LCD 110 of FIG. 18 following the melting phase of annealment. The annealing process includes melting a selected number of microcrystallites 124 in first film 114 to form a second density of microcrystallites and melting a selected number of crystallites in second film 132 to form a fourth density, less than the second density. The microcrystallite density of second film 132 is smaller based on the closer position of second film 132 to the energy source, as well as an initially smaller pre-melt density. Polycrystalline grains are formed in first 114 and second 132 films primarily in response to the nucleation sites in first film 114. That is, the controlled number of microcrystallites seed crystals in first film 114 are used as nucleation sites for both the first 114 and second 132 films.

Returning to FIGS. 13–16, there are a number of methods of measuring the microcrystallite content in microcrystalline film 114. In some aspects of the invention, microcrystallites 116 in microcrystalline film 114 have a crystalline fraction, as defined above, in the range from approximately 0.01 to 80%, whereby the distribution and size of crystal grains is regulated in response to the number of seed crystals 116 in microcrystalline film 114. In some aspects of the invention, a crystalline fraction in the range between approximately 0.01 and 25%, or between approximately 0.01 and 5% is formed. Further, with respect to the above-mentioned crystalline fractions, the size of microcrystallites 116 are in the range of approximately 1000 Å, or less. With respect to the above-mentioned crystalline fractions and crystallite sizes, an effective post-melt, second density is approximately $1 \times 10^8$ per $cm^2$, or larger, with an average separation between post-melt microcrystallites of approximately 1 micron.

In some aspects of the invention, microcrystalline film 114 is formed from controlled deposition conditions has an optical gap of 1.8 eV, or larger. The optical gap measurement is another method of measuring the microcrystallite content of microcrystalline film 114. Preferably, the optical gap is in the range from 1.8 eV to 2.2 eV.

In some aspects of the invention, microcrystalline film 114 is formed having the center of the transverse-optical phonon Raman peak (TO-peak) at a wave-number greater than 470 $cm^{-1}$ and a full-width half maximum (FWHM) value of less than 70 $cm^{-1}$. TO-peak and FWHM are alternate methods of measuring microcrystallite content. Preferably, microcrystalline film 114 is formed having the center of the TO-peak at a wave-number in the range from 470 to 510 $cm^{-1}$ and a FWHM value in the range from 15 to 70 $cm^{-1}$.

The present invention was developed in response to uncertainties in the deposition of amorphous film on transparent substrates, and in response to the lack of uniformity in the annealment process, especially when an excimer laser is used. Because the excimer laser allows more selective heating of the silicon film, more options in the annealment process are provided. However, the high energies, short durations, and small apertures of the excimer laser beam also result in non-uniformities in the annealment process. The use of microcrystallites 116 to regulate the annealment process reduces dependence on the chemical composition of microcrystalline film 114, the thickness of film 114, and inconsistencies in the heating and annealment process.

It is an aspect of the invention that amorphous matter 115 and microcrystallites 116 are silicon. It is another aspect of the invention that amorphous matter 115 and microcrystallites 116 are a silicon-germanium compound.

It is an aspect of the invention that microcrystallites 116, embedded in microcrystalline film 114, have a substantially predetermined first crystallographic orientation. Referring to FIG. 16, polycrystalline film 131 has the first crystallographic orientation of microcrystallites 116 in FIG. 13. The use of a common crystallographic orientation throughout polycrystalline film 131 minimizes grain boundary resistance to electron flow. Preferably, the first crystallographic orientation of embedded microcrystallites 116 is (110) or (111). In the above-described process, the crystallographic orientation of microcrystallites 116 are determined before microcrystallites 116 are embedded in film 114. A preferred crystallographic orientation, or texture, is developed by appropriate selection of film deposition conditions. The preferred texture of the deposited microcrystallites is transferred to the crystal grains formed after the annealing process.

In another aspect of the invention, microcrystallites 116 have a random crystallographic orientation when they are embedded in microcrystalline film 114, before annealment. Microcrystalline film 114 is selectively heated to annihilate microcrystallites 116 not having a predetermined first crystallographic orientation. Microcrystalline film 114 is annealed to have substantially a first crystallographic orientation of the surviving microcrystallite 116. Referring to FIG. 16, a common crystallographic orientation throughout polycrystalline film 131 minimizes grain boundaries. That is, the heat in the annealment process is selected to melt all crystallites 116 except crystallites 116 having the first crystallographic orientation. Microcrystallites 116, having the first crystallographic orientation, survive the annealment process because they melt at a higher temperature than microcrystallites 116 of other crystallographic orientations. Preferably, the first crystallographic orientation of embedded microcrystallites 116 is (110) or (111).

Referring again to FIG. 14, it is an aspect of the invention that film 114 is annealed with an excimer laser (ELC) using light 118 having a wave length of approximately 308 nanometers (nm), or less, to melt amorphous matter 115 and selectively melt microcrystallites 116. It is another aspect of the invention that microcrystalline film 114 is annealed with a rapid thermal anneal (RTA) crystallization process, not shown, at a temperature below approximately 800° C. for a duration generally in the range between 1 and 100 seconds.

Referring again to FIG. 13, it is an aspect of the invention that microcrystalline film 114 has a thickness 117 of less than approximately 1000Å. Referring again to FIG. 16, a polycrystalline film 131 of this thickness is suitable for the manufacture of thin film transistors. Polycrystalline film 131 is well suited for the manufacture of thin film transistors with this smaller thickness. Likewise, the size, or diameter of microcrystallites 116 is preferably 1000 Å, or less.

The simultaneous optimization of the deposition and laser anneal processes is essential for improving the performance of low-temperature p-Si TFTs. Low-rate PECVD-Si precursors are ideal for the improvement of the microstructural characteristics of the p-Si material and the reduction of the optimum laser energy density range. Both factors are of significant interest for the adoption of ELA process in high volume manufacturing. The benefit of the low-rate precursor has been attributed to its high degree of micro-crystallinity that enhances the process of crystalline growth during laser anneal. From this point of view, other deposition methods may also be utilized to deposit $\mu$c-Si precursor. Thus, the properties of the post-ELA p-Si material may be further improved using deposition techniques and chemistries that allow for better control of the size and density of the pre-existing crystallites in the as-deposited film.

The present invention offers possibilities for a new generation of high performance TFTs. Polycrystalline films made per the present invention have high electron mobility and low threshold voltages due to large, uniformly shaped crystal grains. The deposition of silicon film at very low deposition rates provides for the optimum formation of microcrystallites. The present invention relies on the relationships between pre-melt crystalline fraction, post-melt crystalline fraction, and annealing energy density to control the crystal grain size. This microcrystalline film results in a polycrystalline film having larger crystal grains (over 1 $\mu$m), and crystal grains of a relatively uniform size (uniformity of less than 10%). Large uniform grains permit the transistors to have both excellent switching characteristics, high electron mobility, and consistent behavior across the entire film. The improved switching characteristics of transistors fabricated from the polycrystalline film allow driver circuitry, previously positioned around the periphery of the transparent substrate, to be located directly on the substrate. In this manner, the size, and complexity of LCDs are being reduced. Other embodiments of the invention will occur to those skilled in the art.

What is claimed is:

1. In forming thin film transistors in polycrystalline film formed from substantially amorphous matter on a transparent liquid crystal display ("LCD") substrate, a method comprising the steps of:

providing a transparent LCD substrate having a surface for receiving the deposition of semiconductor matter thereon, said substrate surface being flat; and forming a film of polycrystalline semiconductor matter on said flat surface of said LCD substrate, said step of forming a film of polycrystalline semiconductor matter including:

a) depositing amorphous matter on the transparent LCD substrate with a PECVD process using a $SiH_4$ and $H_2$ gas mixture at a power level of approximately 0.16783 W per $cm^2$, at a temperature of approximately 320° C., a total pressure of approximately 1.2 Torr, and a flow rate of $SiH_4$ to $H_2$ of approximately 100:1;

b) depositing the amorphous matter in Step a) at a deposition rate of less than 10 Å/s and a deposition temperature of approximately 380 degrees C., whereby microcrystallites are produced during the deposition step within the amorphous matter to form a microcrystallite film;

c) depositing the microcrystallite film of Step b) to an overall thickness of less than approximately 500 Å;

d) heating the film deposited in Step c) with an ELC process using a wavelength of approximately 308 nm, or less, to selectively melt microcrystallites such that at least some microcrystallites remain to provide seed crystals for subsequent crystallization of the post-melt melted area to form crystal grains in the film; and e) forming a polycrystalline film having an electron mobility of greater than 150 $cm^2$/Vs.

2. A method as in claim 1 in which Step b) includes forming microcrystallites having a size less than approximately 1000 Å.

3. A method as in claim 1 in which the amorphous matter and microcrystallites deposited are silicon.

4. A method as in claim 1 in which the amorphous matter and microcrystallites deposited are a silicon-germanium compound.

5. A method as in claim 1 in which the microcrystallites which remain after Step d) to provide seed crystals for subsequent crystallization of the post-melt melted area have a microcrystallite density of approximately $1 \times 10^8$ microcrystallites per $cm^2$, or greater, with approximately a 1 micron average separation between microcrystallites.

6. A method as in claim 1 in which the microcrystallites produced during the deposition step have a crystallographic orientation selected from the group consisting of (110) and (111).

* * * * *